(12) United States Patent
Tung et al.

(10) Patent No.: US 7,429,334 B2
(45) Date of Patent: Sep. 30, 2008

(54) METHODS OF FABRICATING INTERFEROMETRIC MODULATORS BY SELECTIVELY REMOVING A MATERIAL

(75) Inventors: Ming-Hau Tung, San Francisco, CA (US); Manish Kothari, Cupertino, CA (US); William J. Cummings, San Francisco, CA (US)

(73) Assignee: IDC, LLC, San Francisco, CA (US)

( * ) Notice: Subject to any disclaimer, the term of this patent is extended or adjusted under 35 U.S.C. 154(b) by 0 days.

(21) Appl. No.: 11/090,778

(22) Filed: Mar. 25, 2005

(65) Prior Publication Data

US 2006/0077502 A1 Apr. 13, 2006

Related U.S. Application Data

(60) Provisional application No. 60/613,401, filed on Sep. 27, 2004.

(51) Int. Cl.
*B29D 11/00* (2006.01)
(52) U.S. Cl. .......................................... 216/24; 216/13
(58) Field of Classification Search ................... 216/24, 216/13
See application file for complete search history.

(56) References Cited

U.S. PATENT DOCUMENTS

| | | | |
|---|---|---|---|
| 2,534,846 A | 12/1950 | Ambrose et al. |
| 3,439,973 A | 4/1969 | Paul et al. |
| 3,443,854 A | 5/1969 | Weiss |
| 3,616,312 A | 10/1971 | McGriff et al. |
| 3,653,741 A | 4/1972 | Marks |
| 3,656,836 A | 4/1972 | de Cremoux et al. |
| 3,725,868 A | 4/1973 | Malmer, Jr. et al. |
| 3,813,265 A | 5/1974 | Marks |
| 3,955,880 A | 5/1976 | Lierke |
| 4,099,854 A | 7/1978 | Decker et al. |
| 4,196,396 A | 4/1980 | Smith |
| 4,228,437 A | 10/1980 | Shelton |
| 4,377,324 A | 3/1983 | Durand et al. |
| 4,389,096 A | 6/1983 | Hori et al. |

(Continued)

FOREIGN PATENT DOCUMENTS

CH 681 047 12/1992

(Continued)

OTHER PUBLICATIONS

Akasaka, "Three-Dimensional IC Trends," Proceedings of IEEE, vol. 74, No. 12, pp. 1703-1714, (Dec. 1986).

(Continued)

*Primary Examiner*—Duy-Vu N. Deo
*Assistant Examiner*—Mahmoud Dahimene
(74) *Attorney, Agent, or Firm*—Knobbe Martens Olson & Bear LLP

(57) ABSTRACT

Methods for making MEMS devices such as interferometric modulators involve selectively removing a sacrificial portion of a material to form an internal cavity, leaving behind a remaining portion of the material to form a post structure. The material may be blanket deposited and selectively altered to define sacrificial portions that are selectively removable relative to the remaining portions. Alternatively, a material layer can be laterally recessed away from openings in a covering layer. These methods may be used to make unreleased and released interferometric modulators.

26 Claims, 20 Drawing Sheets

U.S. PATENT DOCUMENTS

| | | |
|---|---|---|
| 4,392,711 A | 7/1983 | Moraw et al. |
| 4,403,248 A | 9/1983 | te Velde |
| 4,441,791 A | 4/1984 | Hornbeck |
| 4,445,050 A | 4/1984 | Marks |
| 4,459,182 A | 7/1984 | te Velde |
| 4,482,213 A | 11/1984 | Piliavin et al. |
| 4,500,171 A | 2/1985 | Penz et al. |
| 4,519,676 A | 5/1985 | te Velde |
| 4,531,126 A | 7/1985 | Sadones |
| 4,566,935 A | 1/1986 | Hornbeck |
| 4,571,603 A | 2/1986 | Hornbeck et al. |
| 4,596,992 A | 6/1986 | Hornbeck |
| 4,615,595 A | 10/1986 | Hornbeck |
| 4,617,608 A | 10/1986 | Blonder et al. |
| 4,662,746 A | 5/1987 | Hornbeck |
| 4,663,083 A | 5/1987 | Marks |
| 4,681,403 A | 7/1987 | te Velde et al. |
| 4,710,732 A | 12/1987 | Hornbeck |
| 4,748,366 A | 5/1988 | Taylor |
| 4,786,128 A | 11/1988 | Birnbach |
| 4,790,635 A | 12/1988 | Apsley |
| 4,856,863 A | 8/1989 | Sampsell et al. |
| 4,859,060 A | 8/1989 | Kitagiri et al. |
| 4,900,136 A | 2/1990 | Goldburt et al. |
| 4,900,395 A | 2/1990 | Syverson et al. |
| 4,937,496 A | 6/1990 | Neiger et al. |
| 4,954,789 A | 9/1990 | Sampsell |
| 4,956,619 A | 9/1990 | Hornbeck |
| 4,965,562 A | 10/1990 | Verhulst |
| 4,982,184 A | 1/1991 | Kirkwood |
| 5,018,256 A | 5/1991 | Hornbeck |
| 5,022,745 A | 6/1991 | Zayhowski et al. |
| 5,028,939 A | 7/1991 | Hornbeck et al. |
| 5,037,173 A | 8/1991 | Sampsell et al. |
| 5,044,736 A | 9/1991 | Jaskie et al. |
| 5,061,049 A | 10/1991 | Hornbeck |
| 5,075,796 A | 12/1991 | Schildkraut et al. |
| 5,078,479 A | 1/1992 | Vuilleumier |
| 5,079,544 A | 1/1992 | DeMond et al. |
| 5,083,857 A | 1/1992 | Hornbeck |
| 5,096,279 A | 3/1992 | Hornbeck et al. |
| 5,099,353 A | 3/1992 | Hornbeck |
| 5,124,834 A | 6/1992 | Cusano et al. |
| 5,136,669 A | 8/1992 | Gerdt |
| 5,142,405 A | 8/1992 | Hornbeck |
| 5,142,414 A | 8/1992 | Koehler |
| 5,153,771 A | 10/1992 | Link et al. |
| 5,162,787 A | 11/1992 | Thompson et al. |
| 5,168,406 A | 12/1992 | Nelson |
| 5,170,156 A | 12/1992 | DeMond et al. |
| 5,172,262 A | 12/1992 | Hornbeck |
| 5,179,274 A | 1/1993 | Sampsell |
| 5,192,395 A | 3/1993 | Boysel et al. |
| 5,192,946 A | 3/1993 | Thompson et al. |
| 5,206,629 A | 4/1993 | DeMond et al. |
| 5,212,582 A | 5/1993 | Nelson |
| 5,214,419 A | 5/1993 | DeMond et al. |
| 5,214,420 A | 5/1993 | Thompson et al. |
| 5,216,537 A | 6/1993 | Hornbeck |
| 5,226,099 A | 7/1993 | Mignardi et al. |
| 5,228,013 A | 7/1993 | Bik |
| 5,231,532 A | 7/1993 | Magel et al. |
| 5,233,385 A | 8/1993 | Sampsell |
| 5,233,456 A | 8/1993 | Nelson |
| 5,233,459 A | 8/1993 | Bozler et al. |
| 5,254,980 A | 10/1993 | Hendrix et al. |
| 5,272,473 A | 12/1993 | Thompson et al. |
| 5,278,652 A | 1/1994 | Urbanus et al. |
| 5,280,277 A | 1/1994 | Hornbeck |
| 5,287,096 A | 2/1994 | Thompson et al. |
| 5,293,272 A | 3/1994 | Jannson et al. |
| 5,296,950 A | 3/1994 | Lin et al. |
| 5,299,041 A | 3/1994 | Morin et al. |
| 5,305,640 A | 4/1994 | Boysel et al. |
| 5,311,360 A | 5/1994 | Bloom et al. |
| 5,312,513 A | 5/1994 | Florence et al. |
| 5,323,002 A | 6/1994 | Sampsell et al. |
| 5,324,683 A | 6/1994 | Fitch et al. |
| 5,325,116 A | 6/1994 | Sampsell |
| 5,326,430 A | 7/1994 | Cronin et al. |
| 5,327,286 A | 7/1994 | Sampsell et al. |
| 5,330,617 A | 7/1994 | Haond |
| 5,331,454 A | 7/1994 | Hornbeck |
| 5,339,116 A | 8/1994 | Urbanus et al. |
| 5,345,328 A | 9/1994 | Fritz et al. |
| 5,347,377 A | 9/1994 | Revelli, Jr. et al. |
| 5,355,357 A | 10/1994 | Yamamori et al. |
| 5,358,601 A | 10/1994 | Cathey |
| 5,365,283 A | 11/1994 | Doherty et al. |
| 5,381,232 A | 1/1995 | van Wijk |
| 5,381,253 A | 1/1995 | Sharp et al. |
| 5,401,983 A | 3/1995 | Jokerst et al. |
| 5,411,769 A | 5/1995 | Hornbeck |
| 5,444,566 A | 8/1995 | Gale et al. |
| 5,446,479 A | 8/1995 | Thompson et al. |
| 5,448,314 A | 9/1995 | Heimbuch et al. |
| 5,452,024 A | 9/1995 | Sampsell |
| 5,454,906 A | 10/1995 | Baker et al. |
| 5,457,493 A | 10/1995 | Leddy et al. |
| 5,457,566 A | 10/1995 | Sampsell et al. |
| 5,459,602 A | 10/1995 | Sampsell |
| 5,459,610 A | 10/1995 | Bloom et al. |
| 5,461,411 A | 10/1995 | Florence et al. |
| 5,474,865 A | 12/1995 | Vasudev |
| 5,489,952 A | 2/1996 | Gove et al. |
| 5,497,172 A | 3/1996 | Doherty et al. |
| 5,497,197 A | 3/1996 | Gove et al. |
| 5,499,037 A | 3/1996 | Nakagawa et al. |
| 5,499,062 A | 3/1996 | Urbanus |
| 5,500,635 A | 3/1996 | Mott |
| 5,500,761 A | 3/1996 | Goossen et al. |
| 5,503,952 A | 4/1996 | Suzuki et al. |
| 5,506,597 A | 4/1996 | Thompson et al. |
| 5,515,076 A | 5/1996 | Thompson et al. |
| 5,517,347 A | 5/1996 | Sampsell |
| 5,523,803 A | 6/1996 | Urbanus et al. |
| 5,526,051 A | 6/1996 | Gove et al. |
| 5,526,172 A | 6/1996 | Kanack |
| 5,526,327 A | 6/1996 | Cordova, Jr. |
| 5,526,688 A | 6/1996 | Boysel et al. |
| 5,535,047 A | 7/1996 | Hornbeck |
| 5,548,301 A | 8/1996 | Kornher et al. |
| 5,551,293 A | 9/1996 | Boysel et al. |
| 5,552,924 A | 9/1996 | Tregilgas |
| 5,552,925 A | 9/1996 | Worley |
| 5,559,358 A | 9/1996 | Burns et al. |
| 5,563,398 A | 10/1996 | Sampsell |
| 5,567,334 A | 10/1996 | Baker et al. |
| 5,570,135 A | 10/1996 | Gove et al. |
| 5,579,149 A | 11/1996 | Moret et al. |
| 5,581,272 A | 12/1996 | Conner et al. |
| 5,583,688 A | 12/1996 | Hornbeck |
| 5,589,852 A | 12/1996 | Thompson et al. |
| 5,597,736 A | 1/1997 | Sampsell |
| 5,600,383 A | 2/1997 | Hornbeck |
| 5,602,671 A | 2/1997 | Hornbeck |
| 5,606,441 A | 2/1997 | Florence et al. |
| 5,608,468 A | 3/1997 | Gove et al. |
| 5,610,438 A | 3/1997 | Wallace et al. |
| 5,610,624 A | 3/1997 | Bhuva |
| 5,610,625 A | 3/1997 | Sampsell |
| 5,619,059 A | 4/1997 | Li et al. |
| 5,619,365 A | 4/1997 | Rhoads et al. |
| 5,619,366 A | 4/1997 | Rhoads et al. |

| | | | | | | |
|---|---|---|---|---|---|---|
| 5,622,814 A | 4/1997 | Miyata et al. | | 6,249,039 B1 | 6/2001 | Harvey et al. |
| 5,629,790 A | 5/1997 | Neukermans et al. | | 6,282,010 B1 | 8/2001 | Sulzbach et al. |
| 5,633,652 A | 5/1997 | Kanbe et al. | | 6,284,560 B1 | 9/2001 | Jech et al. |
| 5,636,052 A | 6/1997 | Arney et al. | | 6,295,154 B1 | 9/2001 | Laor et al. |
| 5,636,185 A | 6/1997 | Brewer et al. | | 6,323,982 B1 | 11/2001 | Hornbeck |
| 5,638,084 A | 6/1997 | Kalt | | 6,327,071 B1 | 12/2001 | Kimura et al. |
| 5,638,946 A | 6/1997 | Zavracky | | 6,329,297 B1 | 12/2001 | Balish et al. |
| 5,641,391 A | 6/1997 | Hunter et al. | | 6,335,831 B2 | 1/2002 | Kowarz et al. |
| 5,646,768 A | 7/1997 | Kaeriyama | | 6,351,329 B1 | 2/2002 | Greywal |
| 5,647,819 A | 7/1997 | Fujita et al. | | 6,356,254 B1 | 3/2002 | Kimura |
| 5,650,834 A | 7/1997 | Nakagawa et al. | | 6,359,673 B1 | 3/2002 | Stephenson |
| 5,650,881 A | 7/1997 | Hornbeck | | 6,376,787 B1 | 4/2002 | Martin et al. |
| 5,654,741 A | 8/1997 | Sampsell et al. | | 6,377,233 B2 | 4/2002 | Colgan et al. |
| 5,657,099 A | 8/1997 | Doherty et al. | | 6,391,675 B1 | 5/2002 | Ehmke et al. |
| 5,659,374 A | 8/1997 | Gale, Jr. et al. | | 6,392,233 B1 | 5/2002 | Channin et al. |
| 5,665,997 A | 9/1997 | Weaver et al. | | 6,392,781 B1 | 5/2002 | Kim et al. |
| 5,673,139 A | 9/1997 | Johnson | | 6,407,851 B1 | 6/2002 | Islam et al. |
| 5,674,757 A | 10/1997 | Kim | | 6,447,126 B1 | 9/2002 | Hornbeck |
| 5,683,591 A | 11/1997 | Offenberg | | 6,452,465 B1 | 9/2002 | Brown et al. |
| 5,703,710 A | 12/1997 | Brinkman et al. | | 6,456,420 B1 | 9/2002 | Goodwin-Johansson |
| 5,706,022 A | 1/1998 | Hato | | 6,465,355 B1 | 10/2002 | Horsley |
| 5,710,656 A | 1/1998 | Goosen | | 6,466,354 B1 | 10/2002 | Gudeman |
| 5,726,480 A | 3/1998 | Pister | | 6,466,358 B2 | 10/2002 | Tew |
| 5,739,945 A | 4/1998 | Tayebati | | 6,473,274 B1 | 10/2002 | Maimone et al. |
| 5,745,193 A | 4/1998 | Urbanus et al. | | 6,480,177 B2 | 11/2002 | Doherty et al. |
| 5,745,281 A | 4/1998 | Yi et al. | | 6,496,122 B2 | 12/2002 | Sampsell |
| 5,771,116 A | 6/1998 | Miller et al. | | 6,513,911 B1 | 2/2003 | Ozaki et al. |
| 5,784,190 A | 7/1998 | Worley | | 6,522,801 B1 | 2/2003 | Aksyuk et al. |
| 5,784,212 A | 7/1998 | Hornbeck | | 6,531,945 B1 | 3/2003 | Ahn et al. |
| 5,793,504 A | 8/1998 | Stoll | | 6,537,427 B1 | 3/2003 | Raina et al. |
| 5,808,780 A | 9/1998 | McDonald | | 6,545,335 B1 | 4/2003 | Chua et al. |
| 5,818,095 A | 10/1998 | Sampsell | | 6,548,908 B2 | 4/2003 | Chua et al. |
| 5,822,110 A | 10/1998 | Dabbaj | | 6,549,338 B1 | 4/2003 | Wolverton et al. |
| 5,822,170 A | 10/1998 | Cabuz et al. | | 6,552,840 B2 | 4/2003 | Knipe |
| 5,824,608 A | 10/1998 | Gotoh et al. | | 6,574,033 B1 | 6/2003 | Chui et al. |
| 5,825,528 A | 10/1998 | Goosen | | 6,577,785 B1 | 6/2003 | Spahn et al. |
| 5,835,255 A * | 11/1998 | Miles ........................ 359/291 | | 6,589,625 B1 | 7/2003 | Kothari et al. |
| 5,842,088 A | 11/1998 | Thompson | | 6,600,201 B2 | 7/2003 | Hartwell et al. |
| 5,867,302 A | 2/1999 | Fleming | | 6,602,791 B2 | 8/2003 | Ouellet et al. |
| 5,896,796 A | 4/1999 | Chih | | 6,606,175 B1 | 8/2003 | Sampsell et al. |
| 5,912,758 A | 6/1999 | Knipe et al. | | 6,608,268 B1 | 8/2003 | Goldsmith |
| 5,943,158 A | 8/1999 | Ford et al. | | 6,610,440 B1 * | 8/2003 | LaFollette et al. ........... 429/122 |
| 5,959,763 A | 9/1999 | Bozler et al. | | 6,618,187 B2 | 9/2003 | Pilossof |
| 5,967,163 A | 10/1999 | Pan et al. | | 6,625,047 B2 | 9/2003 | Coleman, Jr. |
| 5,972,193 A | 10/1999 | Chou et al. | | 6,630,786 B2 | 10/2003 | Cummings et al. |
| 5,976,902 A | 11/1999 | Shih | | 6,632,698 B2 | 10/2003 | Ives |
| 5,986,796 A | 11/1999 | Miles | | 6,635,919 B1 | 10/2003 | Melendez et al. |
| 6,016,693 A | 1/2000 | Viani et al. | | 6,642,913 B1 | 11/2003 | Kimura et al. |
| 6,028,690 A | 2/2000 | Carter et al. | | 6,643,069 B2 | 11/2003 | Dewald |
| 6,031,653 A | 2/2000 | Wang | | 6,650,455 B2 | 11/2003 | Miles |
| 6,038,056 A | 3/2000 | Florence et al. | | 6,657,832 B2 | 12/2003 | Williams et al. |
| 6,040,937 A | 3/2000 | Miles | | 6,666,561 B1 | 12/2003 | Blakley |
| 6,049,317 A | 4/2000 | Thompson et al. | | 6,674,562 B1 | 1/2004 | Miles et al. |
| 6,055,090 A | 4/2000 | Miles et al. | | 6,674,563 B2 | 1/2004 | Chui et al. |
| 6,057,903 A | 5/2000 | Colgan et al. | | 6,680,792 B2 | 1/2004 | Miles |
| 6,061,075 A | 5/2000 | Nelson et al. | | 6,710,908 B2 | 3/2004 | Miles et al. |
| 6,099,132 A | 8/2000 | Kaeriyama | | 6,720,267 B1 | 4/2004 | Chen et al. |
| 6,100,872 A | 8/2000 | Aratani et al. | | 6,736,987 B1 | 5/2004 | Cho |
| 6,113,239 A | 9/2000 | Sampsell et al. | | 6,741,377 B2 * | 5/2004 | Miles ........................ 359/243 |
| 6,115,326 A | 9/2000 | Puma et al. | | 6,741,384 B1 | 5/2004 | Martin et al. |
| 6,147,790 A | 11/2000 | Meier et al. | | 6,741,503 B1 | 5/2004 | Farris et al. |
| 6,158,156 A | 12/2000 | Patrick | | 6,743,570 B2 | 6/2004 | Harnett et al. |
| 6,160,833 A | 12/2000 | Floyd et al. | | 6,747,785 B2 | 6/2004 | Chen et al. |
| 6,165,890 A | 12/2000 | Kohl et al. | | 6,747,800 B1 | 6/2004 | Lin |
| 6,166,422 A | 12/2000 | Qian et al. | | 6,756,317 B2 | 6/2004 | Sniegowski et al. |
| 6,180,428 B1 | 1/2001 | Peeters et al. | | 6,768,097 B1 | 7/2004 | Viktorovitch et al. |
| 6,194,323 B1 | 2/2001 | Downey et al. | | 6,775,174 B2 | 8/2004 | Huffman et al. |
| 6,195,196 B1 | 2/2001 | Kimura et al. | | 6,778,155 B2 | 8/2004 | Doherty et al. |
| 6,201,633 B1 | 3/2001 | Peeters et al. | | 6,778,306 B2 | 8/2004 | Sniegowski et al. |
| 6,204,080 B1 | 3/2001 | Hwang | | 6,782,166 B1 | 8/2004 | Grote et al. |
| 6,232,936 B1 | 5/2001 | Gove et al. | | 6,794,119 B2 | 9/2004 | Miles |
| 6,243,149 B1 | 6/2001 | Swanson et al. | | 6,811,267 B1 | 11/2004 | Allen et al. |
| 6,246,398 B1 | 6/2001 | Koo | | 6,812,482 B2 | 11/2004 | Fleming et al. |

| | | | | | | |
|---|---|---|---|---|---|---|
| 6,819,469 B1 | 11/2004 | Koba | | 2003/0231373 A1 | 12/2003 | Kowarz et al. |
| 6,822,628 B2 | 11/2004 | Dunphy et al. | | 2004/0010115 A1 | 1/2004 | Sotzing |
| 6,829,132 B2 | 12/2004 | Martin et al. | | 2004/0027636 A1 | 2/2004 | Miles |
| 6,844,959 B2 | 1/2005 | Huibers et al. | | 2004/0027701 A1 | 2/2004 | Ishikawa |
| 6,853,129 B1 | 2/2005 | Cummings et al. | | 2004/0028849 A1 | 2/2004 | Stark et al. |
| 6,855,610 B2 | 2/2005 | Tung et al. | | 2004/0035821 A1 | 2/2004 | Doan et al. |
| 6,859,218 B1 | 2/2005 | Luman et al. | | 2004/0051929 A1 | 3/2004 | Sampsell et al. |
| 6,861,277 B1 | 3/2005 | Monroe et al. | | 2004/0053434 A1 | 3/2004 | Bruner |
| 6,862,022 B2 | 3/2005 | Slupe | | 2004/0058531 A1 | 3/2004 | Miles et al. |
| 6,862,029 B1 | 3/2005 | D'Souza et al. | | 2004/0058532 A1 | 3/2004 | Miles et al. |
| 6,867,896 B2 | 3/2005 | Miles | | 2004/0061543 A1 | 4/2004 | Nam et al. |
| 6,870,581 B2 | 3/2005 | Li et al. | | 2004/0063322 A1 | 4/2004 | Yang |
| 6,870,654 B2 | 3/2005 | Lin et al. | | 2004/0080807 A1 | 4/2004 | Chen et al. |
| 6,882,458 B2 | 4/2005 | Lin et al. | | 2004/0080832 A1 | 4/2004 | Singh |
| 6,882,461 B1 | 4/2005 | Tsai et al. | | 2004/0087086 A1 | 5/2004 | Lee |
| 6,905,621 B2 | 6/2005 | Ho et al. | | 2004/0100677 A1 | 5/2004 | Huibers et al. |
| 6,906,847 B2 | 6/2005 | Huibers et al. | | 2004/0124073 A1 | 7/2004 | Pilans et al. |
| 6,912,022 B2 | 6/2005 | Lin et al. | | 2004/0125281 A1 | 7/2004 | Lin et al. |
| 6,952,303 B2 | 10/2005 | Lin et al. | | 2004/0125282 A1 | 7/2004 | Lin et al. |
| 6,952,304 B2 | 10/2005 | Mushika et al. | | 2004/0125536 A1 | 7/2004 | Arney et al. |
| 6,958,847 B2 | 10/2005 | Lin | | 2004/0136076 A1 | 7/2004 | Tayebati Parviz |
| 6,980,350 B2 | 12/2005 | Hung et al. | | 2004/0145049 A1 | 7/2004 | McKinnell et al. |
| 6,982,820 B2 | 1/2006 | Tsai | | 2004/0145811 A1 | 7/2004 | Lin et al. |
| 6,995,890 B2 | 2/2006 | Lin | | 2004/0147056 A1 | 7/2004 | McKinnell et al. |
| 6,999,225 B2 | 2/2006 | Lin | | 2004/0147198 A1 | 7/2004 | Lin et al. |
| 6,999,236 B2 | 2/2006 | Lin | | 2004/0148009 A1 | 7/2004 | Buzzard |
| 7,012,726 B1 | 3/2006 | Miles | | 2004/0150869 A1 | 8/2004 | Kasai |
| 7,027,202 B1 | 4/2006 | Hunter et al. | | 2004/0160143 A1 | 8/2004 | Shreeve et al. |
| 7,041,224 B2 | 5/2006 | Patel et al. | | 2004/0174583 A1 | 9/2004 | Chen et al. |
| 7,042,643 B2 | 5/2006 | Miles et al. | | 2004/0175577 A1 | 9/2004 | Lin et al. |
| 7,049,164 B2 | 5/2006 | Bruner | | 2004/0179281 A1 | 9/2004 | Reboa |
| 7,078,293 B2 | 7/2006 | Lin et al. | | 2004/0179445 A1 | 9/2004 | Park |
| 7,110,158 B2 | 9/2006 | Miles | | 2004/0191937 A1 | 9/2004 | Patel et al. |
| 7,119,945 B2 | 10/2006 | Cummings et al. | | 2004/0191946 A1 | 9/2004 | Patel et al. |
| 7,123,216 B1 | 10/2006 | Miles | | 2004/0197526 A1 | 10/2004 | Mehta |
| 7,172,915 B2 | 2/2007 | Lin et al. | | 2004/0207897 A1 | 10/2004 | Lin |
| 7,198,973 B2 | 4/2007 | Lin et al. | | 2004/0209192 A1 | 10/2004 | Lin et al. |
| 7,221,495 B2 | 5/2007 | Miles et al. | | 2004/0209195 A1 | 10/2004 | Lin |
| 2001/0003487 A1 | 6/2001 | Miles | | 2004/0212026 A1 | 10/2004 | Van Brocklin et al. |
| 2001/0026951 A1 | 10/2001 | Vergani et al. | | 2004/0217378 A1 | 11/2004 | Martin et al. |
| 2001/0040649 A1 | 11/2001 | Ozaki | | 2004/0217919 A1 | 11/2004 | Pichl et al. |
| 2001/0040675 A1 | 11/2001 | True et al. | | 2004/0218251 A1 | 11/2004 | Piehl et al. |
| 2002/0015215 A1* | 2/2002 | Miles ................. 359/290 | | 2004/0218334 A1 | 11/2004 | Martin et al. |
| 2002/0021485 A1 | 2/2002 | Pilossof | | 2004/0218341 A1 | 11/2004 | Martin et al. |
| 2002/0024711 A1 | 2/2002 | Miles | | 2004/0227493 A1 | 11/2004 | Van Brocklin et al. |
| 2002/0036304 A1 | 3/2002 | Ehmke et al. | | 2004/0240027 A1 | 12/2004 | Lin et al. |
| 2002/0054424 A1 | 5/2002 | Miles | | 2004/0240032 A1 | 12/2004 | Miles |
| 2002/0055253 A1 | 5/2002 | Rudhard | | 2004/0240138 A1 | 12/2004 | Martin et al. |
| 2002/0071169 A1 | 6/2002 | Bowers et al. | | 2004/0245588 A1 | 12/2004 | Nikkel et al. |
| 2002/0075555 A1 | 6/2002 | Miles | | 2004/0263944 A1 | 12/2004 | Miles et al. |
| 2002/0086455 A1 | 7/2002 | Franosch et al. | | 2005/0001828 A1 | 1/2005 | Martin et al. |
| 2002/0110948 A1 | 8/2002 | Huang et al. | | 2005/0003667 A1 | 1/2005 | Lin et al. |
| 2002/0117728 A1 | 8/2002 | Brosnihan et al. | | 2005/0020089 A1* | 1/2005 | Shi et al. ................. 438/706 |
| 2002/0126364 A1* | 9/2002 | Miles ................. 359/247 | | 2005/0024557 A1 | 2/2005 | Lin |
| 2002/0131682 A1 | 9/2002 | Naairi et al. | | 2005/0035699 A1 | 2/2005 | Tsai |
| 2002/0135857 A1 | 9/2002 | Fitzpatrick et al. | | 2005/0036095 A1 | 2/2005 | Yeh et al. |
| 2002/0137072 A1 | 9/2002 | Mirkin et al. | | 2005/0036192 A1 | 2/2005 | Lin et al. |
| 2002/0149828 A1 | 10/2002 | Miles | | 2005/0038950 A1 | 2/2005 | Adelmann |
| 2002/0168136 A1 | 11/2002 | Atia et al. | | 2005/0042117 A1 | 2/2005 | Lin |
| 2003/0003372 A1 | 1/2003 | Hutchinson | | 2005/0046922 A1 | 3/2005 | Lin et al. |
| 2003/0006468 A1 | 1/2003 | Ma et al. | | 2005/0046948 A1 | 3/2005 | Lin |
| 2003/0043157 A1 | 3/2003 | Miles | | 2005/0057442 A1 | 3/2005 | Way |
| 2003/0054588 A1 | 3/2003 | Patel et al. | | 2005/0068583 A1 | 3/2005 | Gutkowski et al. |
| 2003/0062186 A1 | 4/2003 | Boroson et al. | | 2005/0068605 A1 | 3/2005 | Tsai |
| 2003/0072070 A1 | 4/2003 | Miles | | 2005/0068606 A1 | 3/2005 | Tsai |
| 2003/0090350 A1 | 5/2003 | Feng et al. | | 2005/0069209 A1 | 3/2005 | Damera-Venkata et al. |
| 2003/0112096 A1 | 6/2003 | Potter | | 2005/0078348 A1 | 4/2005 | Lin |
| 2003/0138213 A1 | 7/2003 | Jiin et al. | | 2005/0118832 A1 | 6/2005 | Korzenski et al. |
| 2003/0152872 A1 | 8/2003 | Miles | | 2005/0128565 A1 | 6/2005 | Ljungblad |
| 2003/0201784 A1 | 10/2003 | Potter | | 2005/0168849 A1 | 8/2005 | Lin |
| 2003/0202264 A1 | 10/2003 | Weber et al. | | 2005/0195462 A1 | 9/2005 | Lin |
| 2003/0202265 A1 | 10/2003 | Reboa et al. | | 2005/0195467 A1 | 9/2005 | Kothari et al. |
| 2003/0202266 A1 | 10/2003 | Ring et al. | | 2005/0202649 A1 | 9/2005 | Hung et al. |

| | | | |
|---|---|---|---|
| 2006/0024880 | A1 | 2/2006 | Chui et al. |
| 2006/0066932 | A1 | 3/2006 | Chui |
| 2006/0066935 | A1 | 3/2006 | Cummings et al. |
| 2006/0076311 | A1 | 4/2006 | Tung et al. |
| 2006/0256420 | A1 | 11/2006 | Miles et al. |
| 2007/0064760 | A1 | 3/2007 | Kragh |

FOREIGN PATENT DOCUMENTS

| | | |
|---|---|---|
| CN | 1341546 | 3/2002 |
| CN | 092109265 | 11/2003 |
| DE | 199 38 072 | 3/2000 |
| DE | 10228946 | 1/2004 |
| DE | 10228946 A1 | 1/2004 |
| EP | 0 035 299 | 9/1983 |
| EP | 0173808 | 3/1986 |
| EP | 0 667 548 A1 | 8/1995 |
| EP | 0694801 A | 1/1996 |
| EP | 0695959 A | 2/1996 |
| EP | 0878824 A2 | 11/1998 |
| EP | 1197778 A | 4/2002 |
| EP | 1258860 A1 | 11/2002 |
| EP | 1 452 481 A | 9/2004 |
| JP | 05275401 A1 | 10/1993 |
| JP | 10500224 | 1/1998 |
| JP | 10-148644 | 6/1998 |
| JP | 10-267658 | 10/1998 |
| JP | 11211999 A | 8/1999 |
| JP | 11243214 | 9/1999 |
| JP | 2000-40831 A | 2/2000 |
| JP | 2002-0287047 | 3/2001 |
| JP | 2002 062493 | 2/2002 |
| JP | 2002-207182 | 7/2002 |
| JP | 2002-243937 | 8/2002 |
| JP | 2002-270575 | 9/2002 |
| JP | 2002-355800 | 12/2002 |
| JP | 2003001598 A | 1/2003 |
| JP | 2004-102022 A | 4/2004 |
| JP | 2004-106074 A | 4/2004 |
| JP | 2004106074 | 4/2004 |
| JP | 2004-212656 | 7/2004 |
| JP | 2005051007 A | 2/2005 |
| KR | 2002-9270 | 10/1999 |
| KR | 2000-0033006 | 6/2000 |
| WO | WO 92/10925 | 6/1992 |
| WO | WO 95/30924 | 11/1995 |
| WO | WO9717628 | 5/1997 |
| WO | WO9952006 A2 | 10/1999 |
| WO | WO9952006 A3 | 10/1999 |
| WO | WO0114248 | 3/2001 |
| WO | WO 02/24570 | 3/2002 |
| WO | WO03007049 A1 | 1/2003 |
| WO | WO 03/052506 | 6/2003 |
| WO | WO 03/069413 A | 8/2003 |
| WO | WO03069413 A1 | 8/2003 |
| WO | WO03073151 A1 | 9/2003 |
| WO | WO2004006003 A1 | 1/2004 |
| WO | WO2004026757 A2 | 4/2004 |
| WO | WO 04/079058 | 9/2004 |
| WO | WO 2005/019899 A1 | 3/2005 |
| WO | WO2005/085932 A | 9/2005 |
| WO | WO 2006/036385 | 4/2006 |
| WO | WO 2006/036437 | 4/2006 |
| WO | WO2006/036542 | 4/2006 |

OTHER PUBLICATIONS

APO Report Aug. 12, 2005.
APO Report, May 4, 2005.
Aratani et al., "Surface micromachined tuneable interferometer array," Sensors and Actuators, pp. 17-23. (1994).
Conner, "Hybrid Color Display Using Optical Interference Filter Array," SID Digest, pp. 577-580 (1993).
EP 05255661.0 European Search Report (Dec. 30, 2005).
Fan et al., "Channel Drop Filters in Photonic Crystals," Optics Express, vol. 3, No. 1 (1998).
Giles et al., "A Silicon MEMS Optical Switch Attenuator and Its Use in Lightwave Subsystems," IEEE Journal of Selected Topics in Quanum Electronics, vol. 5, No. 1, pp. 18-25, (Jan./Feb. 1999).
Goossen et al., "Possible Display Applications of the Silicon Mechanical Anti-Reflection Switch," Society for Information Display (1994).
Goossen et al., "Silicon Modulator Based on Mechanically-Active Anti-Reflection layer with 1Mbit/sec Capability for Fiber-in-the-Loop Applications," IEEE Photonics Technology Letters, pp. 1119, 1121 (Sep. 1994).
Goossen K.W., "MEMS-Based Variable Optical Interference Devices", Optical MEMS, 2000 IEEE/Leos International Conference on Aug. 21-24, 2000, Piscataway, NJ, USA, IEE, Aug. 21, 2000, pp. 17-18.
Gosch, "West Germany Grabs the Lead in X-Ray Lithography," Electronics pp. 78-80 (Feb. 5, 1987).
Harnett et al., "Heat-depolymerizable polycarbonates as electron beam patternable sacrificial layers for nanofluidics," J. Vac. Sci. Technol. B 19(6), (Nov./Dec. 2001), pp. 2842-2845.
Howard et al., "Nanometer-Scale Fabrication Techniques," VLSI Electronics: Microstructure Science, vol. 5, pp. 145-153 and pp. 166-173 (1982).
Ibbotson et al., "Comparison of XeF2 and F-atom reactions with Si and SiO2," Applied Physics Letters, vol. 44, No. 12, pp. 1129-1131 (Jun. 1984).
Jackson "Classical Electrodynamics," John Wiley & Sons Inc., pp. 568-573, date unknown.
Jerman et al., "A Miniature Fabry-Perot Interferometer with a Corrugated Silicon Diaphragm Support," (1988).
Joannopoulos et al., "Photonic Crystals: Molding the Flow of Light," Princeton University Press (1995).
Johnson, "Optical Scanners," Microwave Scanning Antennas, vol. 1, p. 251-261, (1964).
Kim et al., "Control of Optical Transmission Through Metals Perforated With Subwavelength Hole Arrays," Optic Letters, vol. 24, No. 4, pp. 256-257, (Feb. 1999).
Lee et al., "The Surface/Bulk Micromachining (SBM) Process: A New Method for Fabricating Released MEMS in Single Crystal Silicon", Journal of Microelectromechanical Systems, vol. 8, Issue 4, pp. 409-416, (Dec. 1999).
Lee et al., "Electrostatic Actuation of Surface/Bulk Micromachined Single-Crystal Silicon Microresonators", International Conference on Intelligent Robots and Systems, vol. 2, pp. 1057-1062, (Oct. 17-21, 1999).
Light over Matter, Circle No. 36 (Jun. 1993).
Lin et al., "Free-Space Micromachined Optical Switches for Optical Networking," IEEE Journal of Selected Topics in Quantum Electronics, vol. 5, No. 1, pp. 4-9. (Jan./Feb. 1999).
Little et al., "Vertically Coupled Microring Resonator Channel Dropping Filter," IEEE Photonics Technology Letters, vol. 11, No. 2, (1999).
Magel, "Integrated Optic Devices Using Micromachined Metal Membranes," SPIE vol. 2686, 0-8194-2060-Mar. (1996).
Miles, Mark, W., "A New Reflective FPD Technology Using Interferometric Modulation," The Proceedings of the Society for Information Display (May 11-16, 1997).
Nagami et al., "Plastic Cell Architecture: Towards Reconfigurable Computing For General-Purpose," IEEE, 0-8186-8900-, pp. 68-77, (May 1998).
Newsbreaks, "Quantum-trench devices might operate at terahertz frequencies," Laser Focus World (May 1993).
Oliner et al., "Radiating Elements and Mutual Coupling," Microwave Scanning Antennas, vol. 2, pp. 131-141, (1966).
PCT/US02/13442, Search Report Sep. 13, 2002.
PCT/US04/20330 Search Report Nov. 8, 2004.
PCT/US05/029821 International Search Report (Dec. 27, 2005).
PCT/US05/030927 International Search Report (Jan. 25, 2006).
PCT/US05/031693 International Search Report.
PCT/US05/032231 International Search Report (Apr. 7, 2006).
PCT/US05/033558 Partial International Search Report (Feb. 24, 2006).

PCT/US2004/035820 International Search Report and Written Opinion (Apr. 11, 2005).
PCT/US96/17731 Search Report.
Raley et al., "A Fabry-Perot Microinterferometer for Visible Wavelengths," IEEE Solid-State Sensor and Actuator Workshop, Jun. 1992, Hilton Head, SC.
Schnakenberg et al., "TMAHW Etchants for Silicon Micromachining," 1991 International Conference on Solid State Sensors and Actuators-Digest of Technical Papers, pp. 815-818 (1991).
Sperger et al., "High Performance Patterned All-Dielectric Interference Colour Filter for Display Applications," SID Digest, pp. 81-83, (1994).
Sridharan et al. "Post-Packaging Release a New Concept for Surface-Micromachined Devices" Technical Digest, IEEE Solid-State Sensor & Actuator Workshop, New York, NY, US, Nov. 8, 1998, pp. 225-228, XP000992464.
Stone, "Radiation and Optics, An Introduction to the Classical Theory," McGraw-Hill, pp. 340-343, (1963).
Walker et al., "Electron-beam-tunable Interference Filter Spatial Light Modulator," Optics Letters vol. 13, No. 5, pp. 345-347, (May 1988).
Williams et al., "Etch Rates for Micromachining Processing," Journal of Microelectromechanical Systems, vol. 5, No. 4, pp. 256-259 (Dec. 1996).
Winters et al., "The etching of silicon with XeF2 vapor. Applied Physics Letters," vol. 34, No. 1, pp. 70-73 (Jan. 1979).
Winton, "A novel way to capture solar energy," Chemical Week, (May 1985).
Wu, "Design of a Reflective Color LCD Using Optical Interference Reflectors," ASIA Display '95, pp. 929-931, (Oct. 1995).
Zhou et al., "Waveguide Panel Display Using Electromechanical Spatial Modulators" SID Digest, vol. XXIX, (1998).
RCO Pt Pub 157313, filed May 1, 1991, FSI International.
Aratani et al., "Process and Design Considerations for Surface Micromachined Beams for a Tuneable Interferometer Array in Silicon," Proc. IEEE Microelectromechanical Workshop, Fort Lauderdale, FL, pp. 230-235 (Feb. 1993).
Austrian Search Report for EX72/2005 dated May 13, 2005.
Austrian Search Report for EX81/2005 dated May 18, 2005.
Austrian Search Report for EX170/2005 dated Jul. 6, 2005.
Austrian Search Report for EX139/2005 dated Jul. 27, 2005.
Austrian Search Report for EX144/2005 dated Aug. 11, 2005.
Bains, "Digital Paper Display Technology Holds Promise For Portables," CommsDesign EE Times (2000).
Bass, Handbook of Optics, vol. 1, Fundamentals, Techniques, and Design, Second Edition, McGraw-Hill, inc. New York pp. 2.29/2.36 (1995).
Chu, et al. "Formation and Microstructures of Anodic Aluminoa Films from Aluminum Sputtered onglass Substrate" Journal of the Electrochemical Society, 149 (7) B321-B327 (2002).
Crouse, "Self-ordered pore structure of anodized aluminum on silicon and pattern transfer" Applied Physics Letters, vol. 76, No. 1, Jan. 3, 2000. pp. 49-51.
French, P.J. "Development of Surface Micromachining techniques compatable with on-chip electronics" Journal of Micromechanics and microengineering vol. 6 No. 2, 197-211 XP 002360789 Jun. (1996) IOP Publishing.
Furneaux, et al. "The Formation of Controlled-porosity membranes from Anodically Oxidized Aluminium" Nature vo 337 Jan. 12, 1989, pp. 147-149.

Jerman J. H. et al., "Maniature Fabry-Perot Interferometers Micromachined in Silicon for Use in Optical Fiber WDM Systems," Transducers. San Francisco, Jun. 24-27, 1991, Proceedings of the International Conference on Solid State Sensors Andactuators, New Youk IEEE, US, vol. Conf. 6, Jun. 24, 1991.
Lieberman, "MEMS Display Looks to Give PDAs Sharper Image," EE Times (Feb. 11, 1997).
Lieberman, "Microbridges at Heart of New MEMS Displays," EE Times (Apr. 24, 1997).
Maboudian, et al. Critical Review: Adhesion in Surface Micromechanical Structures: J. Vac. Sci Techno. B 15(1) Jan./Feb. 1997, pp. 1-20.
Microchem, LOR Lift-Off Resists Datasheet, 2002.
Miles, "Interferometric Modulation: MOEMS as an Enabling Technology for High-Performance Reflective Displays," Proceedings of the International Society for Optical Engineering, San Jose, CA, vol. 49085, pp. 131-139 (Jan. 28, 2003).
Miles, et al., "10.1: Digital Paper for Reflective Displays," 2002 SID International Symposium Digest of Technical Papers, Boston, MA, SID International Symposium Digest of Technical Papers, San Jose, CA, vol. 33 / 1, pp. 115-117 (May 21-23, 2002).
Penta Vacuum MEMS Etcher Specifications, http://www.pentavacuum.com/memes.htm.
Science and Technology, The Economist, pp. 89-90, (May 1999).
Search Report PCT/US05/031237 (Dec. 29, 2005).
Search Report PCT/US05/030033 and Written Opinion.
Search Report PCT/US05/030902.
Search Report and Written Opinion for PCT/US05/33558 (May 19, 2005).
Search Report PCT/US05/032331 (Apr. 7, 2006).
Search Report PCT/US05/032331 (Jan. 9, 2006).
Search Report and Written Opinion for PCT/US05/032647.
Tayebi et al. "Reducing the Effects of adhesion and friction in microelectomechanical systesm (MEMS) through surface roughening: Comparison Between theory and experiments" http://jap.ajp.org/jap/copyright.isp Journal of applied Physics 98, 073528 (2005).
Thin Film Transistors- Materials and Processes-vol. 1 Amorphous Silicon Thin Film Transistors ed. Yue Kuo, Kluwer Academic Publishers, Boston (2004).
Xactix Xetch X Specifications, http://xactix.com/Xtech X3specs.htm. Jan. 5, 2005.
Xactix Xetch Product information.
Aratani, et al., "Process and Design Considerations for Surface Micromachined Beams for a Tuneable Interferometer Array in Silicon", 0-7803-0957-Feb. 1993, IEEE, 1993, pp. 230-235.
Austrian Search Report (dated May 12, 2005).
Austrian Search Report (dated Jul. 27, 2005).
Office Action dated May 8, 2007 for U.S. Appl. No. 11/090,552 including a Notice of References Cited by Examiner.
Office Action dated Oct. 3, 2007 for U.S. Appl. No. 11/090,552 including a Notice of References Cited by Examiner.
Yao et al., BrF3 dry release technology for large freestanding parylene microstructures and electrostatic actuators, Sensors and Actuators A, vol. 97-98, pp. 771-775, Apr. 2002.
Office Action issued on May 23, 2008 in Chinese patent application No. 200510105060.0.
Office Action issued on May 9, 2008 in corresponding Chinese patent application No. 200510105046.0.
Office Action issued on May 16, 2008 in corresponging Mexican patent application No. PA/a/2005/010356.

* cited by examiner

18A

18B

18C

METHODS OF FABRICATING INTERFEROMETRIC MODULATORS BY SELECTIVELY REMOVING A MATERIAL

CROSS-REFERENCE TO RELATED APPLICATION

This application claims priority to U.S. patent application Ser. No. 60/613,401, filed Sep. 27, 2004 which is hereby incorporated by reference in its entirety.

BACKGROUND

1. Field of the Invention

The field of the invention relates to microelectromechanical systems (MEMS).

2. Description of the Related Technology

Microelectromechanical systems (MEMS) include micro mechanical elements, actuators, and electronics. Micromechanical elements may be created using deposition, etching, and or other micromachining processes that etch away parts of substrates and/or deposited material layers or that add layers to form electrical and electromechanical devices. One type of MEMS device is called an interferometric modulator. An interferometric modulator may comprise a pair of conductive plates, one or both of which may be transparent and/or reflective in whole or part and capable of relative motion upon application of an appropriate electrical signal. One plate may comprise a stationary layer deposited on a substrate, the other plate may comprise a metallic membrane separated from the stationary layer by a gap. Such devices have a wide range of applications, and it would be beneficial in the art to utilize and/or modify the characteristics of these types of devices so that their features can be exploited in improving existing products and creating new products that have not yet been developed.

SUMMARY

The system, method, and devices of the invention each have several aspects, no single one of which is solely responsible for its desirable attributes. Without limiting the scope of this invention, its more prominent features will now be discussed briefly. After considering this discussion, and particularly after reading the section entitled "Detailed Description of Preferred Embodiments" one will understand how the features of this invention provide advantages over other display devices.

One aspect provides a method for making an interferometric modulator that includes depositing a material over a first mirror layer; forming a second mirror layer over the material; and selectively removing a sacrificial portion of the material to thereby form a cavity and a post structure of the interferometric modulator. The post structure includes a remaining portion of the material. In some embodiments, the material is a material that can be selectively altered to render it easier or more difficult to remove. For example, the material may be a radiation sensitive polymer such as a photoresist. The formation of the cavity and post may be facilitated, in the case of a radiation sensitive polymer, by irradiating the polymer in such a way as to make the sacrificial portion selectively removable relative to the remaining portion that is included in the post. In other embodiments, the material is not necessarily selectively altered to make it easier or more difficult to remove, and the selective removal of the sacrificial portion is accomplished by selective etching techniques relative to other surrounding materials as the material is laterally recessed away from carefully positioned openings in an overlying cover layer.

Another aspect provides an unreleased MEMS substrate that includes a material, the MEMS substrate being configured so that a sacrificial portion of the material is removable to form a cavity and so that a remaining portion of the material forms a post structure of an interferometric modulator upon removal of the sacrificial portion. The material may be a material that can be selectively altered to render portions of it selectively removable to other portions, or may be a material that is removable by selective etching techniques relative to other surrounding materials.

Another aspect provides a method for making an interferometric modulator. The interferometric modulator includes at least a first mirror, a second mirror separated from the first mirror by a cavity, and a post structure positioned at a side of the cavity and configured to support the second mirror spaced from the first mirror. The method for making this interferometric modulator includes providing a substrate, the substrate having a first area configured to underlie the first mirror and a second area configured to underlie the post structure, then depositing a first mirror layer over at least the first area. The method further includes depositing a material over the first area and the second area and selectively altering the material over the first area, the material over the second area, or both. The method further includes depositing a second mirror layer over at least the first area. The material over the first area is selected to be removable so that, upon removal of a sacrificial portion, a cavity and a post structure of the interferometric modulator are formed, where the post structure includes the material over the second area that remains after removal of the sacrificial portion. The material may be a material that can be selectively altered to render it easier or more difficult to remove, or may be a material that is removable by selective etching techniques.

Another aspect provides a method for making an interferometric modulator that includes depositing a material over a first mirror layer and depositing a second layer over the material. The second layer includes an opening formed through the second layer and configured to expose the material. The method further includes flowing an etchant through the opening and etching the material for a period of time that is effective to remove a sacrificial portion of the material to thereby form a cavity and a post structure of the interferometric modulator, the post structure comprising a remaining portion of the material. The etching may include laterally recessing the material away from the opening. The post structure formed by the method may have a re-entrant profile.

Another aspect provides an unreleased MEMS substrate that includes an underlying material and an overlying layer. The overlying layer is configured so that a sacrificial portion of the material is removable to form a cavity. The overlying layer is also configured so that a remaining portion of the material forms a post structure of an interferometric modulator upon removal of the sacrificial portion.

Another aspect provides a method for making an interferometric modulator. The interferometric modulator includes at least a first mirror, a second mirror separated from the first mirror by a cavity, and a post structure positioned at a side of the cavity and configured to support the second mirror spaced from the first mirror. The method for making the interferometric modulator includes providing a substrate that has a first area configured to underlie the first mirror and a second area configured to underlie the post structure, and depositing a first mirror layer over at least the first area. The method further includes depositing a material over the first area and over the second area, and depositing a second mirror layer over at least the material over the first area. The method further includes forming a plurality of openings configured to facilitate flow of an etchant to the material over the first area. The material over the first area is removable by the etchant to thereby form the cavity and the post structure, where the post structure comprises the material over the second area.

Another aspect provides an interferometric modulator that includes a post structure that has a re-entrant profile. For example, the post structure may have a generally concave cross-section or a generally convex cross-section.

These and other embodiments are described in greater detail below.

DETAILED DESCRIPTION OF PREFERRED EMBODIMENTS

Figure 1:
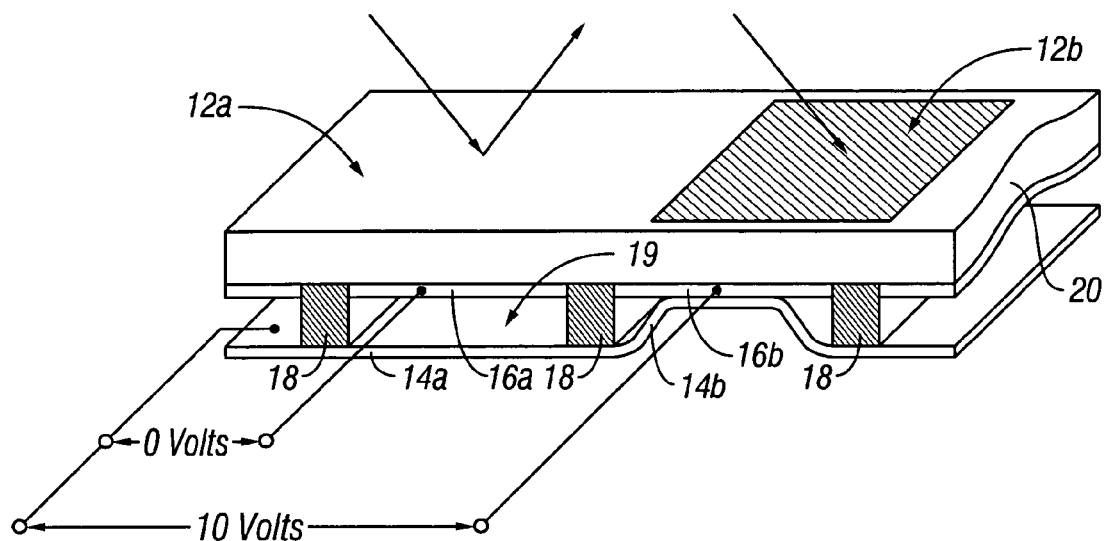
FIG. 1 is an isometric view depicting a portion of one embodiment of an interferometric modulator display in which a movable reflective layer of a first interferometric modulator is in a released position and a movable reflective layer of a second interferometric modulator is in an actuated position.

Preferred embodiments are directed to methods for making interferometric modulators in which the internal cavities and posts are both formed from a blanket layer by selectively removing a material, leaving behind the remaining material to form post structures. These methods may be used to make unreleased and released interferometric modulators. For example, an unreleased interferometric modulator substrate may be formed by depositing a first mirror layer, depositing a photosensitive polymer over the first mirror layer and over an adjacent area that will underlie a post structure in the resulting interferometric modulator, and then depositing a second mirror layer over the photosensitive polymer. The photosensitive polymer is irradiated to render a sacrificial portion of the photosensitive polymer that is between the first mirror layer and the second mirror layer selectively removable, thereby forming a cavity. The portion of the photosensitive polymer that is over the area that is adjacent to the first mirror layer remains behind to form a post structure after removal of the sacrificial portion. In another embodiment, the material between the mirror layers need not be a photosensitive polymer. For example, the material may be a blanket molybdenum layer and the overlying second mirror layer may be provided with vias that are positioned to allow a etchant (such as $XeF_2$) to selectively etch the molybdenum relative to the mirror layers. The molybdenum is thus recessed laterally under the second mirror layer, but only a sacrificial portion of the molybdenum is removed, leaving a remaining part of the molybdenum behind to form posts.

An embodiment provides a method for making an interferometric modulator comprising depositing a photosensitive polymer onto a substrate and selectively irradiating the photosensitive polymer to form a sacrificial layer and a post structure. For example, the photosensitive polymer may be selectively crosslinked by irradiation to form a post structure in the selectively irradiated areas and a sacrificial layer in the non-irradiated areas. The non-irradiated sacrificial portions are readily susceptible to removal by dissolution, e.g., by washing with commercially available resist stripping solutions that do not remove the irradiated portions. As another example, the photosensitive polymer may be selectively degraded by irradiation to form a sacrificial layer in the selectively irradiated area and a post structure in non-irradiated areas. In another embodiment, the method is continued by selectively etching the sacrificial layer (e.g., using a solvent that preferentially dissolves the sacrificial layer, leaving the post structure).

The following detailed description is directed to certain specific embodiments of the invention. However, the invention can be embodied in a multitude of different ways. In this description, reference is made to the drawings wherein like parts are designated with like numerals throughout.

As will be apparent from the following description, the structure described herein may be implemented in any device that is configured to display an image, whether in motion (e.g., video) or stationary (e.g., still image), and whether textual or pictorial. More particularly, it is contemplated that the structures and methods may be implemented in or associated with a variety of electronic devices such as, but not limited to, mobile telephones, wireless devices, personal data assistants (PDAs), hand-held or portable computers, GPS receivers/navigators, cameras, MP3 players, camcorders, game consoles, wrist watches, clocks, calculators, television monitors, flat panel displays, computer monitors, auto displays (e.g., odometer display, etc.), cockpit controls and/or displays, display of camera views (e.g., display of a rear view camera in a vehicle), electronic photographs, electronic billboards or signs, projectors, architectural structures, packaging, and aesthetic structures (e.g., display of images on a piece of jewelry). MEMS devices of similar structure to those described herein can also be used in non-display applications such as in electronic switching devices.

One interferometric modulator display embodiment comprising an interferometric MEMS display element is illustrated in FIG. 1. In these devices, the pixels are in either a bright or dark state. In the bright ("on" or "open") state, the display element reflects a large portion of incident visible light to a user. When in the dark ("off" or "closed") state, the display element reflects little incident visible light to the user. Depending on the embodiment, the light reflectance properties of the "on" and "off" states may be reversed. MEMS pixels can be configured to reflect predominantly at selected colors, allowing for a color display in addition to black and white.

FIG. 1 is an isometric view depicting two adjacent pixels in a series of pixels of a visual display, wherein each pixel comprises a MEMS interferometric modulator. In some embodiments, an interferometric modulator display comprises a row/column array of these interferometric modulators. Each interferometric modulator includes a pair of reflective layers positioned at a variable and controllable distance from each other to form a resonant optical cavity with at least one variable dimension. In one embodiment, one of the reflective layers may be moved between two positions. In the first position, referred to herein as the released or relaxed state, the movable layer is positioned at a relatively large distance from a fixed partially reflective layer. In the second position, the movable layer is positioned more closely adjacent to the partially reflective layer. Incident light that reflects from the two layers interferes constructively or destructively depending on the position of the movable reflective layer, producing either an overall reflective or non-reflective state for each pixel.

The depicted portion of the pixel array in FIG. 1 includes two adjacent interferometric modulators 12a and 12b. In the interferometric modulator 12a on the left, a movable and highly reflective layer 14a is illustrated in a relaxed position at a predetermined distance from a fixed partially reflective layer 16a. In the interferometric modulator 12b on the right, the movable highly reflective layer 14b is illustrated in an actuated position adjacent to the fixed partially reflective layer 16b.

The fixed layers 16a, 16b are electrically conductive, partially transparent and partially reflective, and may be fabricated, for example, by depositing one or more layers each of chromium and indium-tin-oxide onto a transparent substrate 20. The layers are patterned into parallel strips, and may form row electrodes in a display device as described further below. The movable layers 14a, 14b may be formed as a series of parallel strips of a deposited metal layer or layers (orthogonal to the row electrodes 16a, 16b) deposited on top of posts 18 and an intervening sacrificial material deposited between the posts 18. When the sacrificial material is etched away, the deformable metal layers are separated from the fixed metal layers by a defined gap 19. A highly conductive and reflective material such as aluminum may be used for the deformable layers, and these strips may form column electrodes in a display device.

With no applied voltage, the cavity 19 remains between the layers 14a, 16a and the deformable layer is in a mechanically relaxed state as illustrated by the pixel 12a in FIG. 1. However, when a potential difference is applied to a selected row and column, the capacitor formed at the intersection of the row and column electrodes at the corresponding pixel becomes charged, and electrostatic forces pull the electrodes together. If the voltage is high enough, the movable layer is deformed and is forced against the fixed layer (a dielectric material which is not illustrated in this Figure may be deposited on the fixed layer to prevent shorting and control the separation distance) as illustrated by the pixel 12b on the right in FIG. 1. The behavior is the same regardless of the polarity of the applied potential difference. In this way, row/column actuation that can control the reflective vs. non-reflective pixel states is analogous in many ways to that used in conventional LCD and other display technologies.

Figure 2:
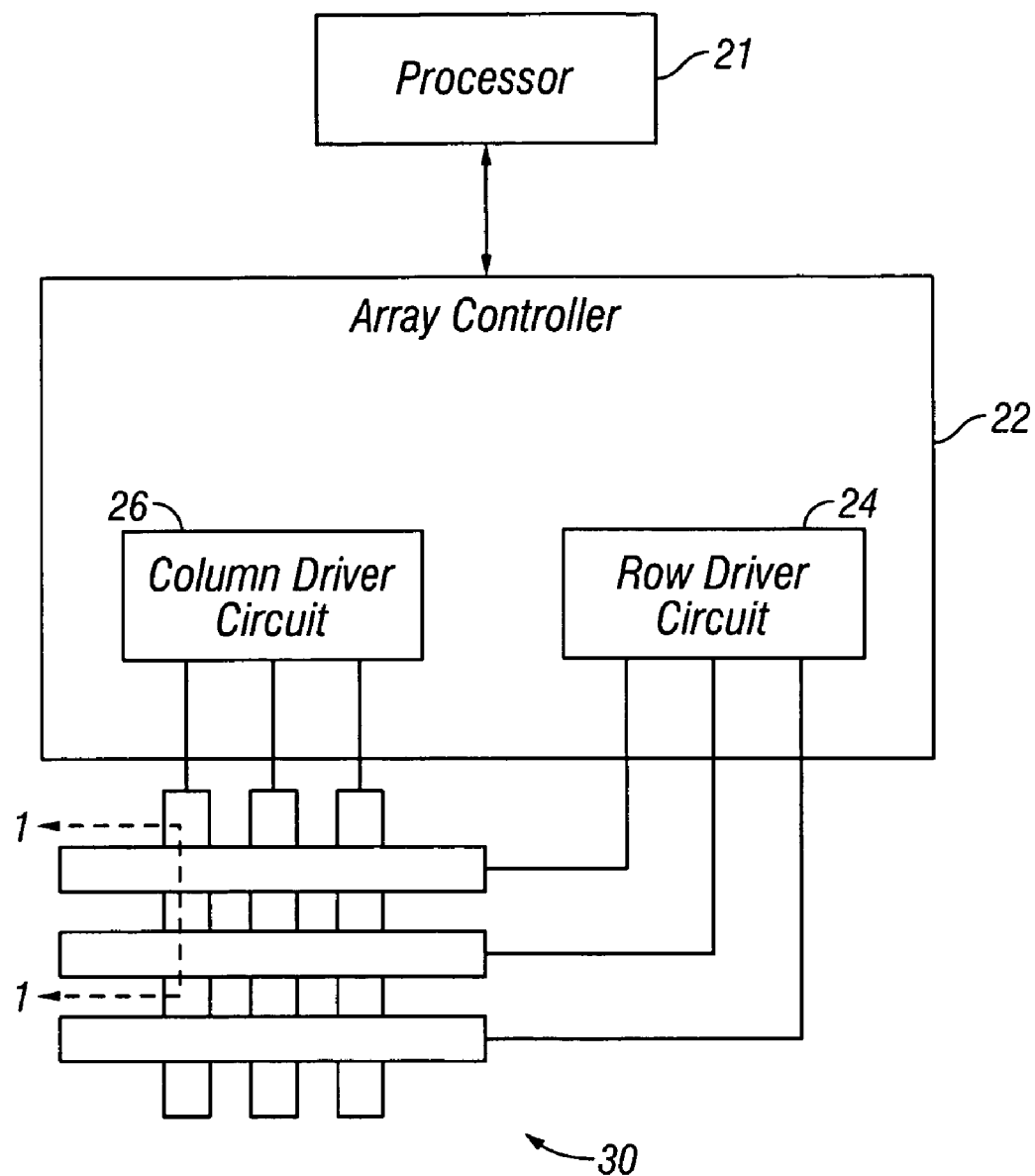
FIG. 2 is a system block diagram illustrating one embodiment of an electronic device incorporating a 3×3 interferometric modulator display.

FIGS. 2 through 5 illustrate one exemplary process and system for using an array of interferometric modulators in a display application. FIG. 2 is a system block diagram illustrating one embodiment of an electronic device that may incorporate aspects of the invention. In the exemplary embodiment, the electronic device includes a processor 21 which may be any general purpose single- or multi-chip microprocessor such as an ARM, PENTIUM®, PENTIUMII®, PENTIUMIII®, PENTIUMIV®, PENTIUM® PRO, an 8051, a MIPS®, a POWER PC®, an ALPHA®, or any special purpose microprocessor such as a digital signal processor, microcontroller, or a programmable gate array. As is conventional in the art, the processor 21 may be configured to execute one or more software modules. In addition to executing an operating system, the processor may be configured to execute one or more software applications, including a web browser, a telephone application, an email program, or any other software application.

In one embodiment, the processor 21 is also configured to communicate with an array controller 22. In one embodiment, the array controller 22 includes a row driver circuit 24 and a column driver circuit 26 that provide signals to a pixel array 30. The cross section of the array illustrated in FIG. 1 is shown by the lines 1-1 in FIG. 2. For MEMS interferometric modulators, the row/column actuation protocol may take advantage of a hysteresis property of these devices illustrated in FIG. 3. It may require, for example, a 10 volt potential difference to cause a movable layer to deform from the relaxed state to the actuated state. However, when the voltage is reduced from that value, the movable layer maintains its state as the voltage drops back below 10 volts. In the exemplary embodiment of FIG. 3, the movable layer does not relax completely until the voltage drops below 2 volts. There is thus a range of voltage, about 3 to 7 V in the example illustrated in FIG. 3, where there exists a window of applied voltage within which the device is stable in either the relaxed or actuated state. This is referred to herein as the "hysteresis window" or "stability window." For a display array having the hysteresis characteristics of FIG. 3, the row/column actuation protocol can be designed such that during row strobing, pixels in the strobed row that are to be actuated are exposed to a voltage difference of about 10 volts, and pixels that are to be relaxed are exposed to a voltage difference of close to zero volts. After the strobe, the pixels are exposed to a steady state voltage difference of about 5 volts such that they remain in whatever state the row strobe put them in. After being written, each pixel sees a potential difference within the "stability window" of 3-7 volts in this example. This feature makes the pixel design illustrated in FIG. 1 stable under the same applied voltage conditions in either an actuated or relaxed pre-existing state. Since each pixel of the interferometric modulator, whether in the actuated or relaxed state, is essentially a capacitor formed by the fixed and moving reflective layers, this stable state can be held at a voltage within the hysteresis window with almost no power dissipation. Essentially no current flows into the pixel if the applied potential is fixed.

In typical applications, a display frame may be created by asserting the set of column electrodes in accordance with the desired set of actuated pixels in the first row. A row pulse is then applied to the row 1 electrode, actuating the pixels corresponding to the asserted column lines. The asserted set of column electrodes is then changed to correspond to the desired set of actuated pixels in the second row. A pulse is then applied to the row 2 electrode, actuating the appropriate pixels in row 2 in accordance with the asserted column were set to during the row 1 pulse. This may be repeated for the entire series of rows in a sequential fashion to produce the frame. Generally, the frames are refreshed and/or updated with new display data by continually repeating this process at some desired number of frames per second. A wide variety of protocols for driving row and column electrodes of pixel arrays to produce display frames are also well known and may be used in conjunction with the present invention.

Figures 3, 4:
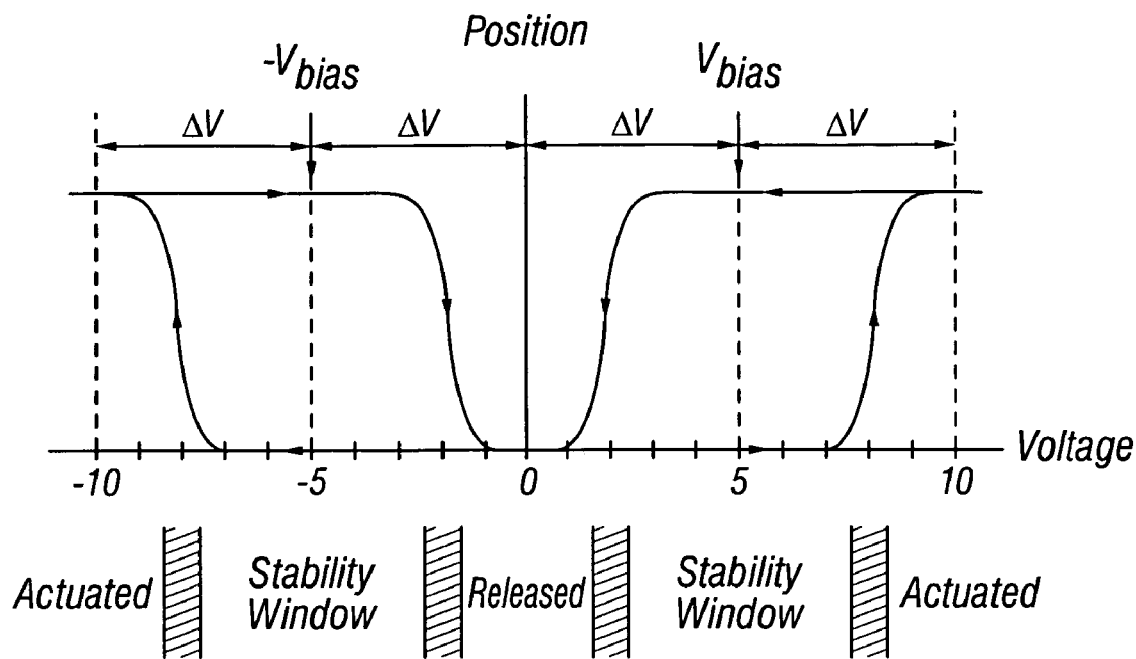
FIG. 3 is a diagram of movable mirror position versus applied voltage for one exemplary embodiment of an interferometric modulator of FIG. 1.
FIG. 4 is an illustration of a set of row and column voltages that may be used to drive an interferometric modulator display.

FIGS. 4 and 5 illustrate one possible actuation protocol for creating a display frame on the 3×3 array of FIG. 2. FIG. 4 illustrates a possible set of column and row voltage levels that may be used for pixels exhibiting the hysteresis curves of FIG. 3. In the FIG. 4 embodiment, actuating a pixel involves setting the appropriate column to $-V_{bias}$, and the appropriate row to $+\Delta V$, which may correspond to $-5$ volts and $+5$ volts respectively Relaxing the pixel is accomplished by setting the appropriate column to $+V_{bias}$, and the appropriate row to the same $+\Delta V$, producing a zero volt potential difference across the pixel. In those rows where the row voltage is held at zero volts, the pixels are stable in whatever state they were originally in, regardless of whether the column is at $+V_{bias}$, or $-V_{bias}$.

Figure 5A:
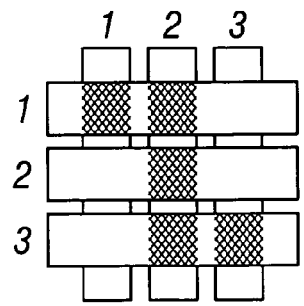
FIGS. 5A and 5B illustrate one exemplary timing diagram for row and column signals that may be used to write a frame of display data to the 3×3 interferometric modulator display of FIG. 2.
Figure 5B:
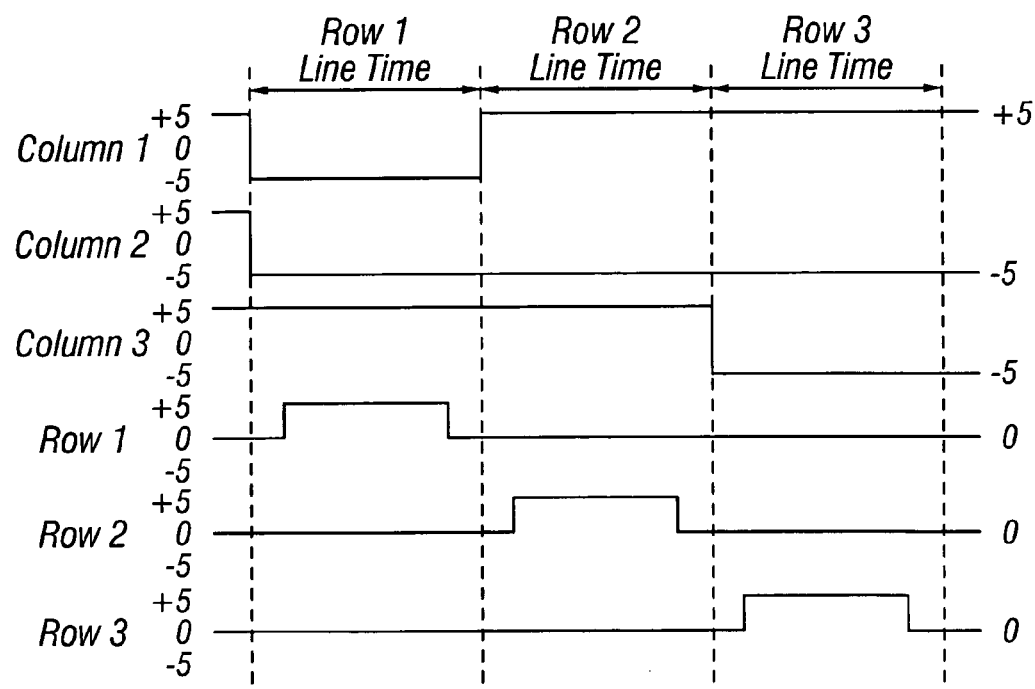

FIG. 5B is a timing diagram showing a series of row and column signals applied to the 3×3 array of FIG. 2 which will result in the display arrangement illustrated in FIG. 5A, where actuated pixels are non-reflective. Prior to writing the frame illustrated in FIG. 5A, the pixels can be in any state, and in this example, all the rows are at 0 volts, and all the columns are at +5 volts. With these applied voltages, all pixels are stable in their existing actuated or relaxed states.

In the FIG. 5A frame, pixels (1,1), (1,2), (2,2), (3,2) and (3,3) are actuated. To accomplish this, during a "line time" for row 1, columns 1 and 2 are set to −5 volts, and column 3 is set to +5 volts. This does not change the state of any pixels, because all the pixels remain in the 3-7 volt stability window. Row 1 is then strobed with a pulse that goes from 0, up to 5 volts, and back to zero. This actuates the (1,1) and (1,2) pixels and relaxes the (1,3) pixel. No other pixels in the array are affected. To set row 2 as desired, column 2 is set to −5 volts, and columns 1 and 3 are set to +5 volts. The same strobe applied to row 2 will then actuate pixel (2,2) and relax pixels (2,1) and (2,3). Again, no other pixels of the array are affected. Row 3 is similarly set by setting columns 2 and 3 to −5 volts, and column 1 to +5 volts. The row 3 strobe sets the row 3 pixels as shown in FIG. 5A. After writing the frame, the row potentials are zero, and the column potentials can remain at either +5 or −5 volts, and the display is then stable in the arrangement of FIG. 5A. It will be appreciated that the same procedure can be employed for arrays of dozens or hundreds of rows and columns. It will also be appreciated that the timing, sequence, and levels of voltages used to perform row and column actuation can be varied widely within the general principles outlined above, and the above example is exemplary only, and any actuation voltage method can be used with the present invention.

Figure 6A:
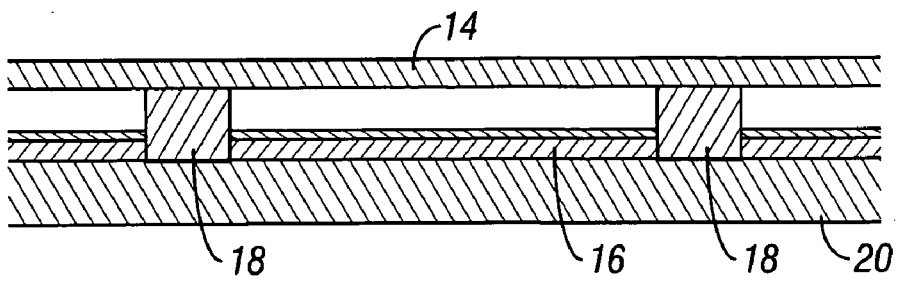
FIG. 6A is a cross section of the device of FIG. 1.
Figure 6B:
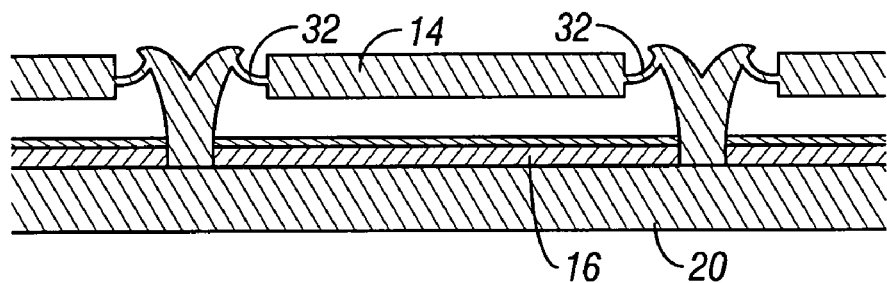
FIG. 6B is a cross section of an alternative embodiment of an interferometric modulator.
Figure 6C:
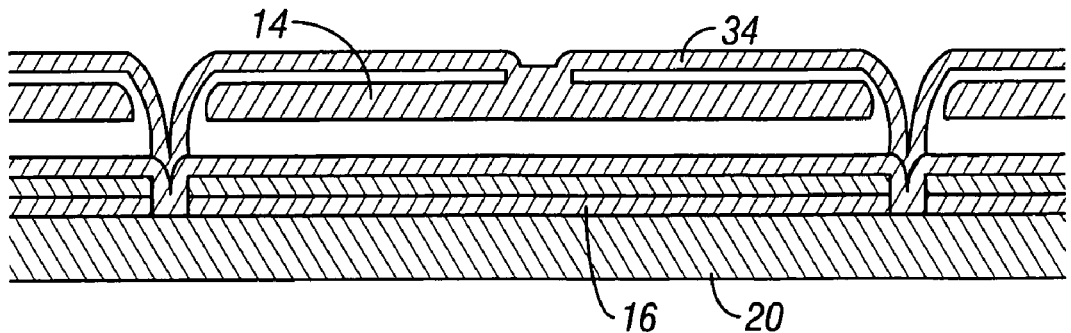
FIG. 6C is a cross section of another alternative embodiment of an interferometric modulator.

The details of the structure of interferometric modulators that operate in accordance with the principles set forth above may vary widely. For example, FIGS. 6A-6C illustrate three different embodiments of the moving mirror structure. FIG. 6A is a cross section of the embodiment of FIG. 1, where a strip of metal material 14 is deposited on orthogonally extending supports 18. In FIG. 6B, the moveable reflective material 14 is attached to supports at the corners only, on tethers 32. In FIG. 6C, the moveable reflective material 14 is suspended from a deformable layer 34. This embodiment has benefits because the structural design and materials used for the reflective material 14 can be optimized with respect to the optical properties, and the structural design and materials used for the deformable layer 34 can be optimized with respect to desired mechanical properties. The production of various types of interferometric devices is described in a variety of published documents, including, for example, U.S. Application Publication No. 2004/0051929. A wide variety of well known techniques may be used to produce the above described structures involving a series of material deposition, patterning, and etching steps.

Figure 7:
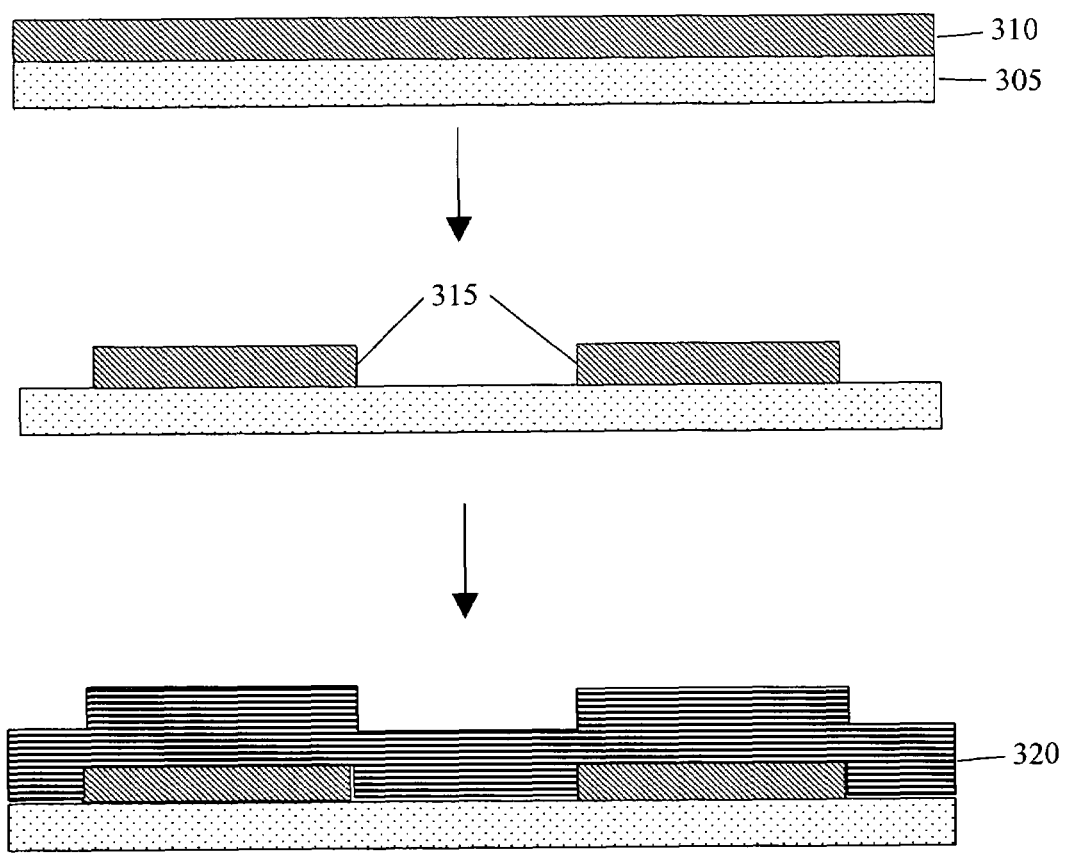
FIGS. 7-9 show cross sectional views that schematically illustrate aspects of a process flow for the fabrication of an interferometric modulator.
Figure 8:
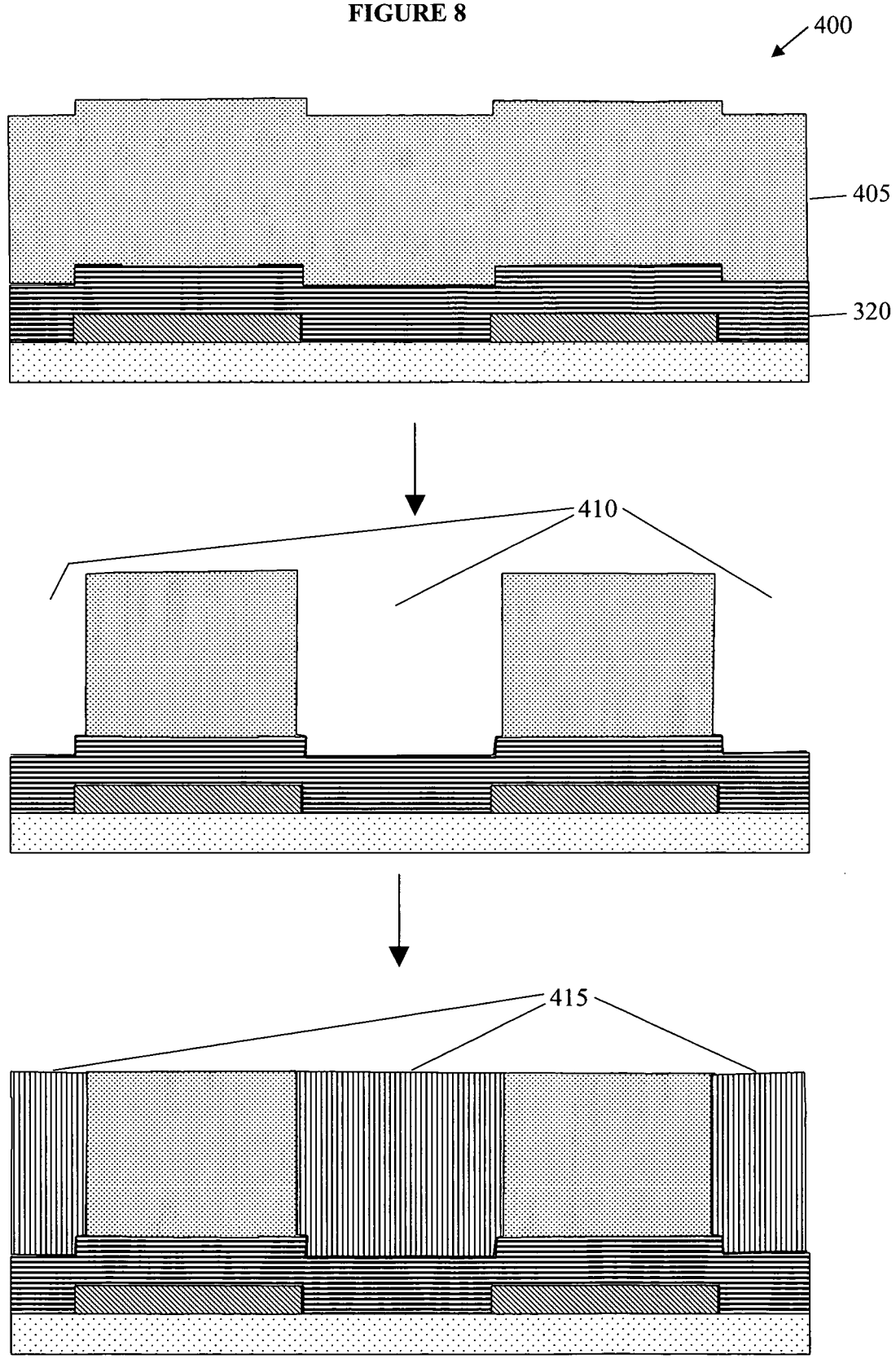
Figure 9:
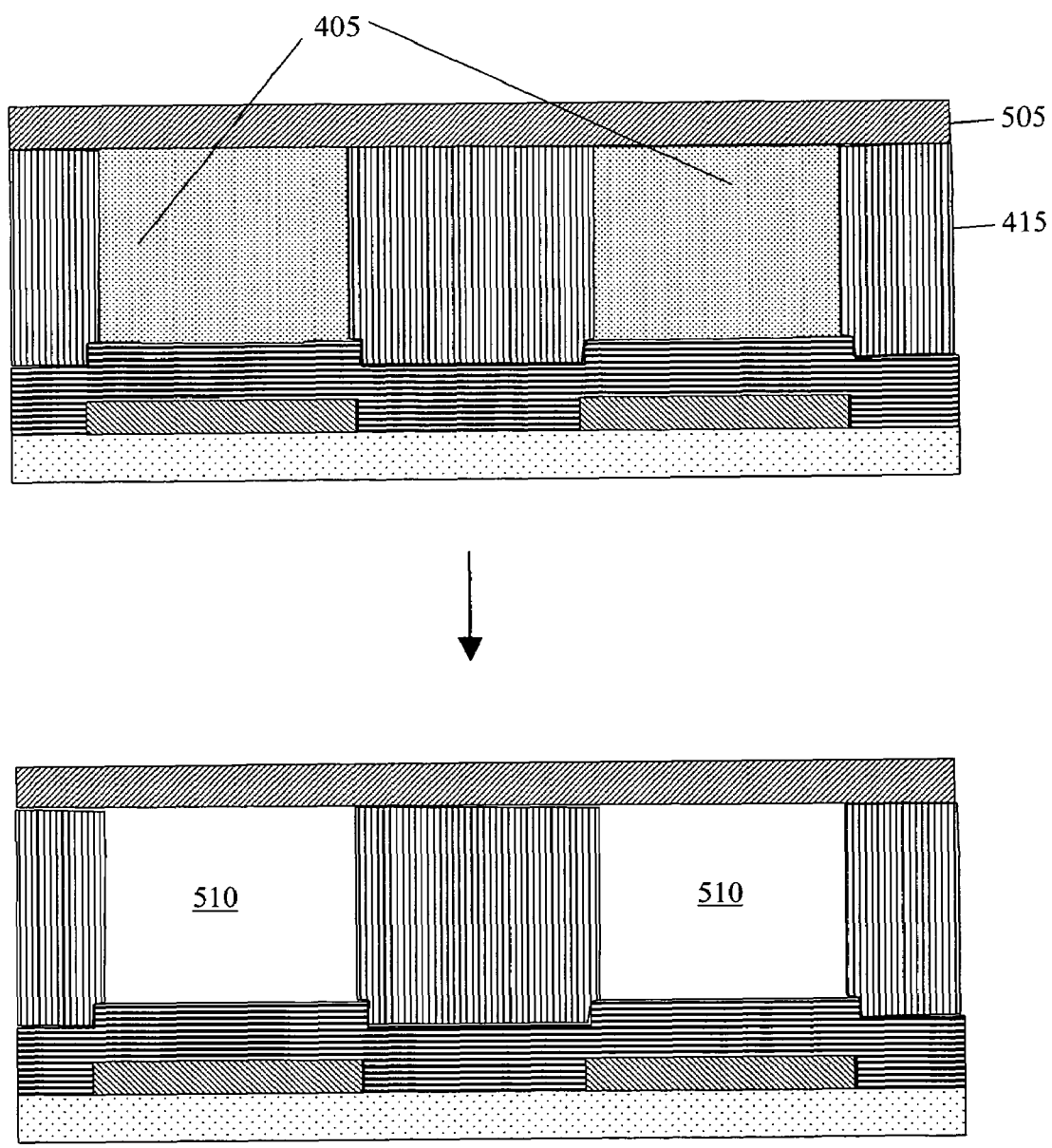

Interferometric modulators of the general design discussed above comprise an interferometric cavity (e.g., cavity 19 in FIGS. 1 and 6) and a post structure (e.g., support 18 in FIGS. 1 and 6), and may be fabricated using the techniques disclosed and/or referenced in U.S. Application Publication No. 2004/0051929. FIGS. 7-9 schematically illustrate aspects of a fabrication process for an interferometric modulator in which the post structure is formed by depositing a sacrificial layer, forming holes in the sacrificial layer, depositing a polymer in the holes, and later removing the sacrificial layer, leaving the polymer behind to form the posts. Those skilled in the art will appreciate that the fabrication processes described herein may be carried out using conventional semiconductor manufacturing techniques such as photolithography, deposition (e.g., "dry" methods such as chemical vapor deposition (CVD) and wet methods such as spin coating), masking, etching (e.g., dry methods such as plasma etch and wet methods), etc.

FIG. 7 illustrates the formation of a first mirror layer 315 by deposition of mirror material 310 on a substrate 305 and subsequent patterning and etching. FIG. 7 further illustrates deposition of a dielectric layer 320 over the first mirror layer 315 and the exposed substrate 305. The mirror material is electrically conductive and may comprise a metal or a semiconductor (such as silicon) doped to have the desired conductivity. In one embodiment, the first mirror layer 315 is a multilayer structure comprising a transparent conductor (such as indium tin oxide) and a primary mirror (such as chromium). In another embodiment, the first mirror layer 315 is a multilayer structure comprising a transparent conductor (such as indium tin oxide), a dielectric layer (silicon oxide) and a primary mirror. In a number of embodiments the first mirror layer (e.g., the first mirror layer 315) also functions as an electrode, and thus the terms "electrode," "mirror" and "mirror layer" may be used interchangeably herein. The dielectric layer 320 may be silicon oxide.

The fabrication process continues as illustrated in FIG. 8 by depositing a sacrificial layer 405 over the dielectric layer 320 to form a structure 400, masking and etching the sacrificial layer 405 to form holes 410, and depositing a polymer in the holes 410 to form post structures 415. The sacrificial layer may be a material (such as molybdenum or silicon) that is capable of being etched by exposure to $XeF_2$ vapor. The polymer may be a negative photoresist material. A second mirror layer 505 is then deposited over the post structures 415 and the sacrificial layer 405 as illustrated in FIG. 9. The second mirror layer 505 is electrically conductive and may be a metal or a semiconductor (such as silicon) doped to have the desired conductivity. In alternate process flows (not shown in FIG. 9), a multi-step process is used to fabricate a second mirror layer that is suspended from a mechanical layer (e.g., as illustrated in FIG. 6C). For embodiments in which the second mirror layer (e.g., the second mirror layer 505) also functions as an electrode, the terms "electrode," "mirror" and "mirror layer" may be used interchangeably. In the illustrated embodiment, the second mirror layer 505 also has a mechanical function during operation of the resulting interferometric modulator, and thus may be referred to herein as a "mechanical" or "deformable" layer. In other configurations, the mirror layer is suspended from the mechanical or deformable layer, e.g., the mirror 14 may be suspended from the deformable layer 34 as illustrated in FIG. 6C. The sacrificial layer 405 is then removed by, e.g., etching, to form an interferometric cavity 510 as illustrated in FIG. 9. A molybdenum or silicon sacrificial layer may be removed by exposure to $XeF_2$ vapor. Those skilled in the art will understand that in the process flow for fabricating an interferometric modulator illustrated in FIGS. 7-9, the sacrificial layer and post structure are formed from different materials, e.g., molybdenum (sacrificial layer) and polymer photoresist (post structure), that are deposited at different stages of the fabrication process.

An improved process for fabricating an interferometric modulator has now been developed that involves depositing a layer of material over a first mirror layer, forming a second mirror layer over the material, and then selectively removing a sacrificial portion of the layer of material to form a cavity and a post structure. The post structure contains a remaining portion of the material layer that is not removed. In some embodiments, the material that is deposited over the first mirror layer (and then selectively removed to form the cavity and post structure) has substantially uniform composition when initially deposited, but is selectively altered during the fabrication process so that the sacrificial portion is easier to remove than the remaining portion that forms the post structure. Selective removal techniques may be used to facilitate removing the sacrificial portion. In other embodiments, the material has a substantially uniform composition throughout deposition and removal, and selective removal techniques (relative to surrounding materials, such as an overlying mechanical layer and underlying dielectric layer) are applied to remove the sacrificial portion (e.g., by isotropic lateral recessing), leaving the remaining portion behind to form at least part of the posts. These and other embodiments are described in greater detail below.

Figure 10:
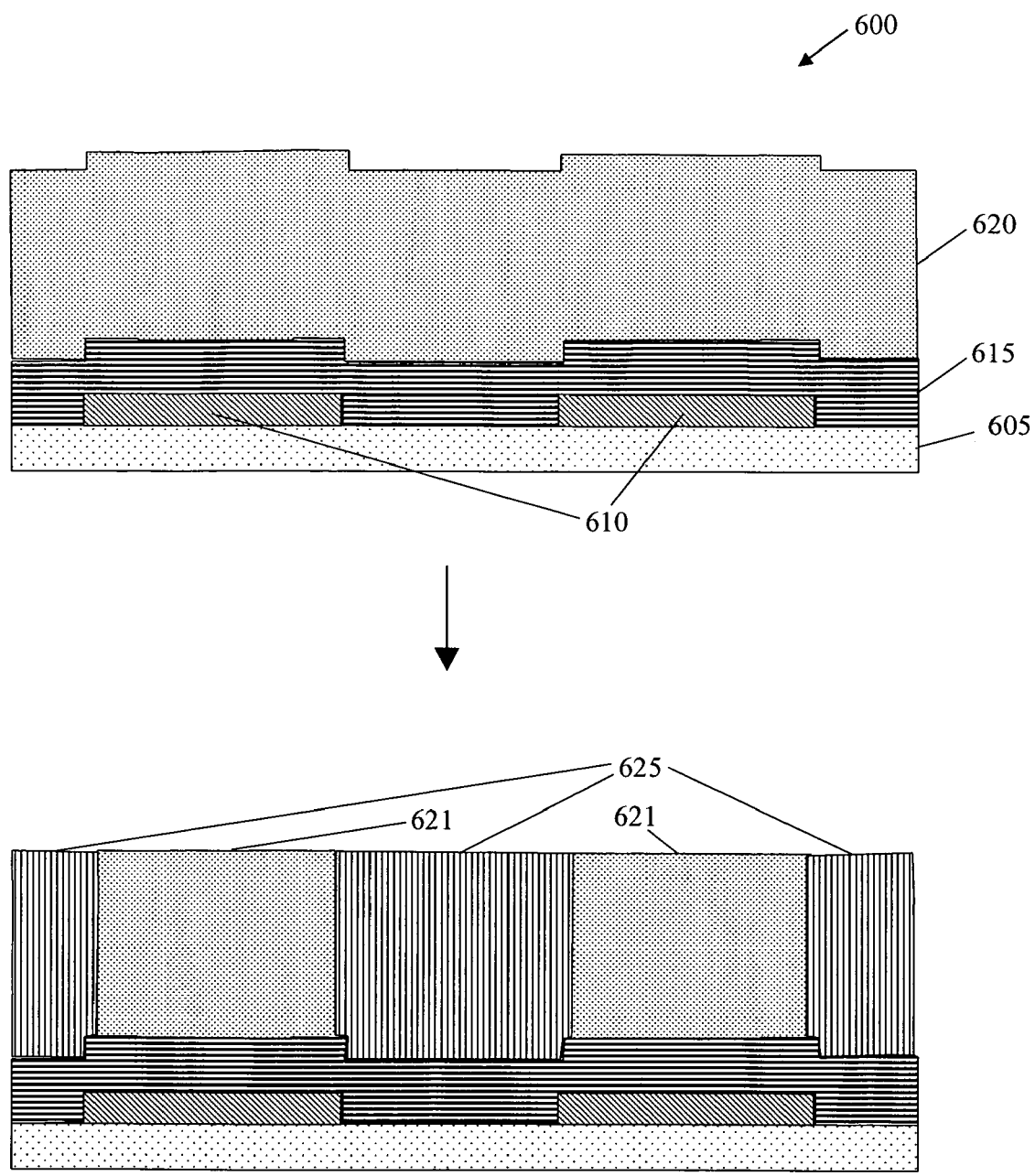
FIGS. 10-11 show cross sectional views of an embodiment that schematically illustrate aspects of a process flow for the fabrication of an interferometric modulator.

In one embodiment, the material has substantially uniform properties when initially deposited, but is selectively altered during the fabrication process so that the sacrificial portion can be selectively removed relative to the remaining portion that forms the post structure. Such an embodiment is illustrated in FIG. 10. The process shown in FIG. 10 begins with a structure 600 that includes a substrate 605, a first mirror layer 610 over the substrate 605, a dielectric layer 615 over the first mirror layer 610 and the substrate 605, and a material 620 over the dielectric layer 615. The structure 600 may be fabricated in the general manner described above with respect to making the structure 400 illustrated in FIG. 8, except that the material 620 is a material that is capable of being selectively altered so that a sacrificial portion is selectively removable relative to the unaltered portion of the material. Photosensitive polymers are non-limiting examples of such materials. Photosensitive polymers include positive photoresists and negative photoresists. Exposure of a positive resist to radiation (e.g., ultraviolet light) alters the polymer so that it becomes easier to remove. Exposure of a negative photoresist to radiation (e.g., ultraviolet light) alters the polymer so that it becomes more difficult to remove. Photosensitive polymers can be selectively irradiated by known techniques (e.g., by masking) so that one or more portions of the polymer are easier to remove than one or more other portions. Silicon is another example of a material that is capable of being selectively altered so that a sacrificial portion is removable. For example, silicon may be selectively altered by ion implantation with oxygen atoms to form silicon oxide(s). Various selective removal chemistries are available to selectively etch silicon oxide(s) relative to silicon and vice versa. Other selective removal chemistries are available for the selective removal of other material systems, e.g., doped vs. undoped silicon, doped vs. undoped silicon oxide(s); nitrided or silicided metal vs. metal, etc. Selective alteration may be conducted by masking a base material (e.g., silicon) and implanting the appropriate ions (e.g., implanting oxygen atoms to form silicon oxide(s)) in the unmasked areas. Preferably, the material 620 is a photoresist that can be patterned using a reticle that blocks light from reaching selected areas of the photoresist during irradiation. The use of such a reticle may reduce or eliminate masking of the base material. Another advantage of photoresists is that they are typically self-planarizing, as they are deposited by spin-on deposition processes.

In the illustrated embodiment, the material 620 is a photosensitive polymer. In FIG. 10, the material 620 is selectively irradiated (e.g., by suitable masking, not shown) to form irradiated portions 625 in the selectively irradiated areas and non-irradiated portions 621 remaining in the non-irradiated areas. In this embodiment, the material 620 is a photosensitive polymer that undergoes crosslinking upon irradiation (e.g., a negative photoresist). Such photosensitive polymers are well known to those skilled in the art. The crosslinking hardens the polymer to form the irradiated portions 625, so that the remaining non-irradiated portions 621 may be selectively removed during a later stage of the process as described below. In other arrangements, the resist may contain photo acid generators (PAGs) activated by exposure to light, rendering the resulting acidic or non-acidic regions selectively removable relative to the other regions.

Figure 11:
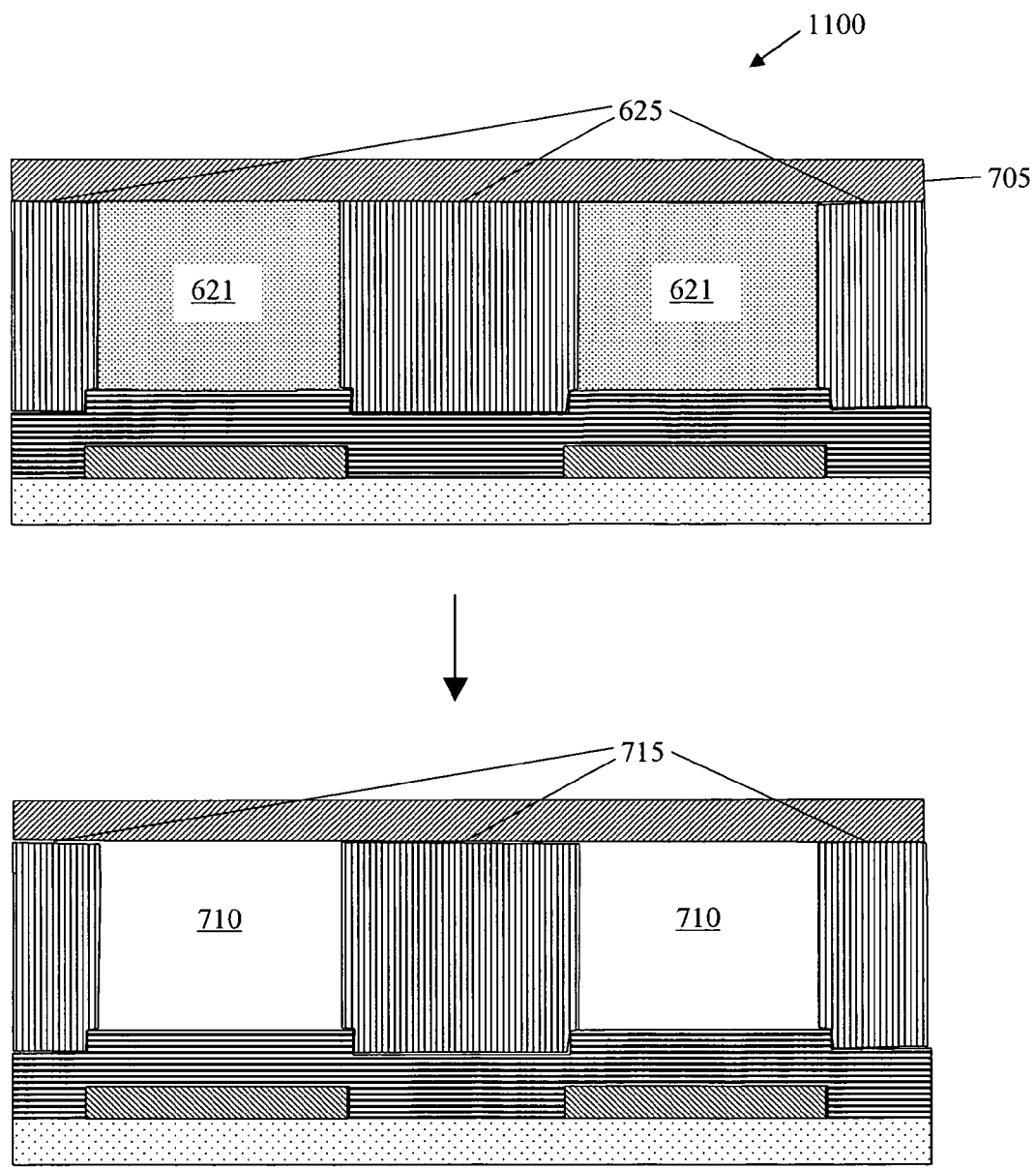

FIG. 11 shows a second mirror layer 705 is then formed over the irradiated portions 625 and the non-irradiated portions 621 to form an unreleased interferometric modulator substrate 1100. In this embodiment, the second mirror layer 705 has a mechanical function and may be referred to as a mechanical or deformable layer. The second mirror layer 705 may be formed by known deposition techniques, e.g., sputtering or chemical vapor deposition. An optional planarization step may be used to planarize the upper parts of the irradiated portions 625 and the non-irradiated portions 621, thus providing a relatively flat surface to underlie the second mirror layer 705. The second mirror layer 705 is electrically conductive and may be a metal or a semiconductor (such as silicon) doped to have the desired conductivity. In this embodiment, the second mirror layer 705 is an electrode. In alternate process flows (not shown in FIG. 11), a multi-step process is used to fabricate a second mirror/electrode that is suspended from a mechanical layer (e.g., as illustrated in FIG. 6C).

The non-irradiated portions 621 of the unreleased substrate 1100 are then removed to form interferometric modulator cavities 710 as illustrated in FIG. 11. The polymer in the irradiated portions 625 has been hardened by crosslinking and thus has a different solubility that the non-irradiated portions 621. Crosslinking can be performed using various forms of energy, e.g., UV, ionizing radiation, heat, etc. Thus, for example, by employing the appropriate etch chemistry, the non-irradiated portions 621 may be selectively removed to form the cavities 710, leaving behind the polymer remaining in the irradiated portions 625 to form post structures 715. In the illustrated embodiment, selective removal of the non-irradiated portions 621 is accomplished by washing with a liquid solvent that preferentially dissolves the uncrosslinked polymer in the non-irradiated portions 621. In alternate embodiments, removal may be accomplished by exposure to a plasma or chemical vapor that preferentially etches the non-irradiated portions 621.

Figure 12:
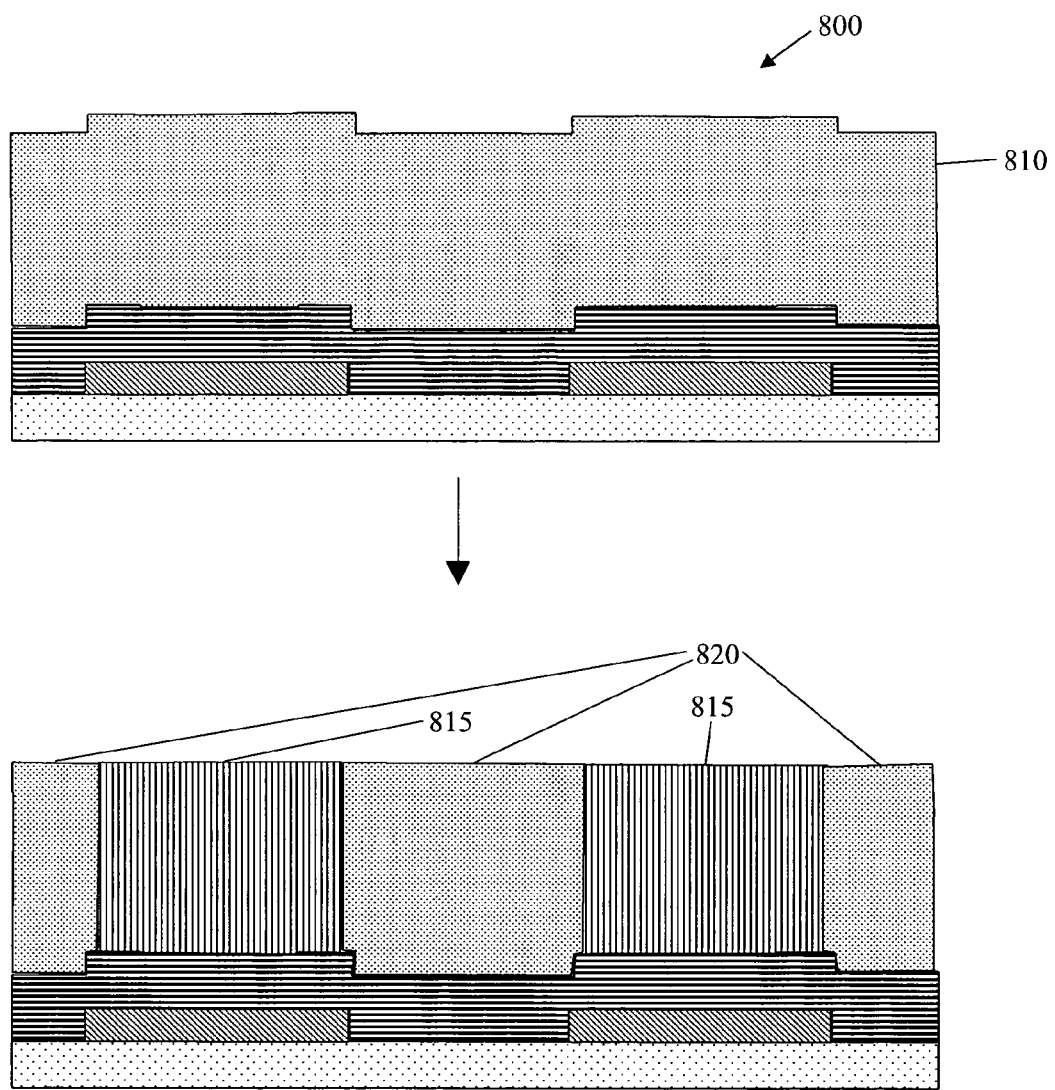
FIG. 12 show cross sectional views of an embodiment that schematically illustrate aspects of a process flow for the fabrication of an interferometric modulator.

In another embodiment, illustrated in FIG. 12, a structure 800 is formed in the same general manner as the structure 600 illustrated in FIG. 10, except that a photosensitive polymer 810 is selected that undergoes degradation upon irradiation (e.g., a positive photoresist) to form irradiated portions 815 in the selectively irradiated areas and non-irradiated portions 820 remaining in the non-irradiated areas. Such selective irradiation may be accomplished by e.g., reversing the masking illustrated in FIG. 10. The fabrication process may then be continued (not shown in FIG. 12) in the general manner described above with respect to FIG. 11, by depositing a second mirror layer and then selectively removing the degraded polymer in the irradiated portions 815 to form cavities, leaving behind the polymer in the non-irradiated portions 820 to form post structures.

The processes illustrated in FIGS. 10-12 may also be carried out using other materials that can be selectively altered so that the altered portions are selectively removable relative to the unaltered portions. For example, those skilled in the art will understand that silicon can be selectively altered by oxygen ion implantation through a suitable mask to form silicon oxide(s) in selected area(s). Selective removal of a sacrificial portion (either the unaltered silicon or the silicon oxide) may then be conducted using a suitable etchant to form a cavity and a post structure in the general manner illustrated in FIGS. 10-12, such that the post structure comprises a remaining portion of the silicon or silicon oxide(s). Other material systems and selective removal chemistries may also be used as discussed above. Those skilled in the art will also understand that the order of the process steps illustrated in FIGS. 10-12 may be changed as desired. For example, alteration of the material 620 by selective irradiation to form irradiated portions 625 in the selectively irradiated areas and non-irradiated portions 621 remaining in the non-irradiated areas as illustrated in FIG. 10 may be conducted prior to forming the second mirror 705 (as illustrated in FIG. 11). In an alternate embodiment (not illustrated), the material 620 is selectively irradiated after the second mirror 705 is formed over the material 620.

Figure 13:
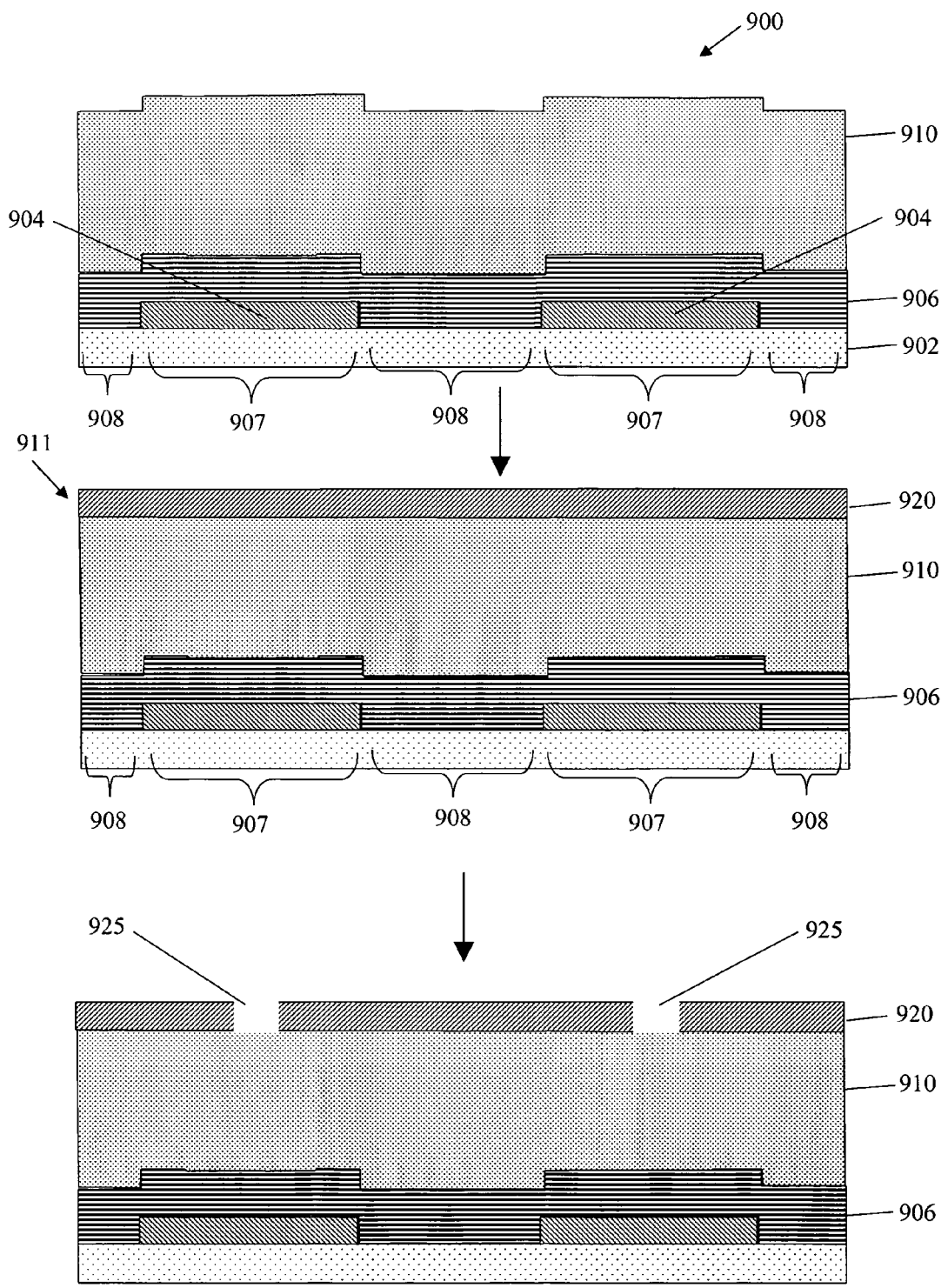
FIGS. 13, 14, 15A and 15B, show cross sectional views of an embodiment that schematically illustrate aspects of a process flow for the fabrication of an interferometric modulator.
Figure 14:
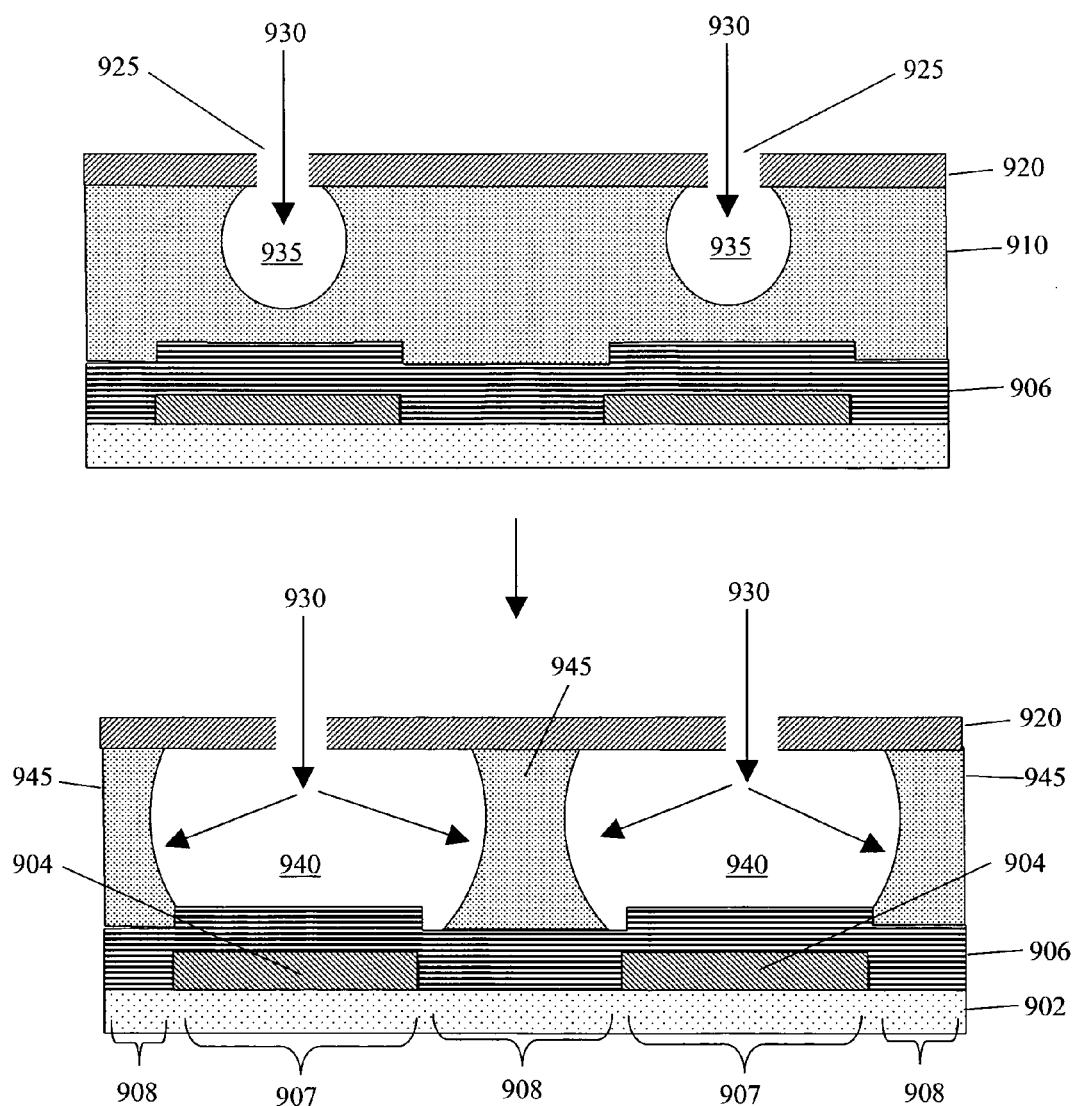

In other embodiments, the material deposited over the first mirror layer has substantially uniform properties throughout deposition and removal. Removal techniques are applied to remove sacrificial portions of the material, leaving remaining portions of the material behind to form at least part of the posts. The removal techniques are selective between the material and other surrounding materials but non-selective between the sacrificial and remaining portions of the material. The process flow shown in FIGS. 13-14 illustrates such an embodiment. The process begins in FIG. 13 with a structure 900 that includes a substrate 902, a first mirror layer 904 over the substrate 902, a dielectric layer 906 over the first mirror layer 904 and the substrate 902, and a material layer 910 over the dielectric layer 906. The substrate 902 includes a first area 907 configured to underlie the first mirror layer 904 and a second area 908 configured to underlie a post structure that will be formed as described below.

The structure 900 may be fabricated in the same general manner as described above with respect to making the structure 400 illustrated in FIG. 8. The material 910 is a material that is capable of being selectively etched relative to other surrounding materials (e.g., the first mirror layer 904 and the dielectric layer 906) by exposure to a suitable etchant to remove a sacrificial portion. Molybdenum and silicon are examples of such materials and $XeF_2$ is an example of a suitable etchant. Those skilled in the art understand that, in this context, the term "$XeF_2$ etchant" refers to the gaseous and/or vaporous substance formed by the sublimation of solid $XeF_2$, and may include $XeF_2$, Xe and $F_2$ in gaseous or vapor form. The material 910 is molybdenum in the illustrated embodiment.

The process illustrated in FIG. 13 continues by forming a second mirror layer 920 over the molybdenum layer 910 and over the first area 907 to form an unreleased interferometric modulator substrate 911. In the illustrated embodiment, the second mirror layer 920 is also formed over the second area 908. In a prior intermediate step (not shown), the molybdenum layer 910 was planarized. Such planarization is optional. Those skilled in the art will understand that, in the illustrated embodiment, the second mirror layer 920 also functions as a mechanical layer and as an electrode in the resulting interferometric modulator, and thus may be referred to as a mechanical layer, deformable layer and/or electrode herein. The process continues by forming vias 925 through the second mirror layer 920 to expose the molybdenum layer 910. The vias 925 are formed in the second mirror layer 920 over areas of the structure 900 in which the creation of optical cavities is desired (e.g., over the first area 907), as explained in greater detail below. The vias 925 may be formed by masking and etching techniques known to those skilled in the art.

The process continues as illustrated in FIG. 14 by introducing a $XeF_2$ etchant 930 through the vias 925 to isotropically selectively etch the molybdenum layer 910 without substantially etching the dielectric layer 906 or the second mirror layer 920. Other selective etchants may also be suitable, depending on the nature of the material 910 and the materials used to form the dielectric layer 906 and the second mirror layer 920, as well as the exigencies of production. In the illustrated embodiment, etching of the molybdenum layer 910 by the etchant 930 proceeds by forming cavities 935 that laterally undercut the second mirror layer 920 and expand in size to form optical cavities 940 over the course of the etching process. The vias 925 are positioned and the etching conditions are selected so that the etchant 930 removes a sacrificial portion of the material layer 910 under the second mirror layer 920 to form the optical cavities 940 over the first area 907 and over the first mirror 904, and so that the remaining portion of the material layer 910 forms post structures 945 that provide support to the second mirror layer 920 over the second area 908. Optionally, production may continue to finish making a MEMS device such as an interferometric modulator. In the illustrated embodiment, the post structures 945 have a re-entrant profile that is generally concave in cross-section. Those skilled in the art will understand that the base of the post structures 945 may be wider than the top, as shown. In the illustrated embodiment, the etchant enters through the vias 925 and thus there tends to be more etching near the top than the bottom, resulting in post structures 925 that tend to be wider at the bottom than at the top.

Figure 15A:
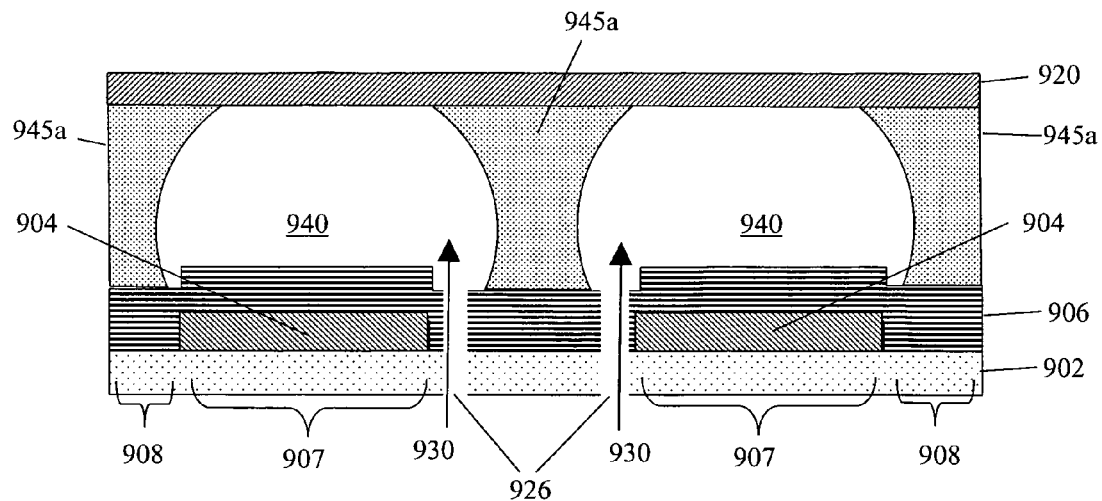
Figure 15B:
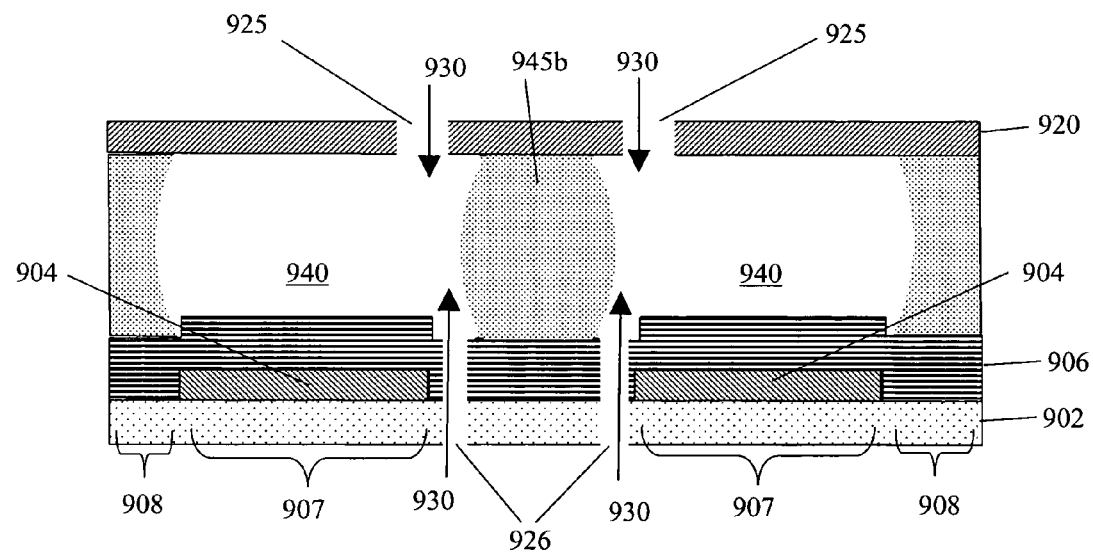

FIG. 15A illustrates another embodiment in which the etchant 930 enters through apertures 926 formed through the substrate 902, in which case there tends to be more etching near the bottom than the top as shown for the post structure 945a. In still another embodiment illustrated in FIG. 15B, the etchant 930 enters through both the vias 925 and the apertures 926, in which case there tends to be more etching near the top and the bottom of the post structure than in the middle, as indicated by the convex cross-section of the post structure 945b in the illustrated embodiment.

Figure 16:
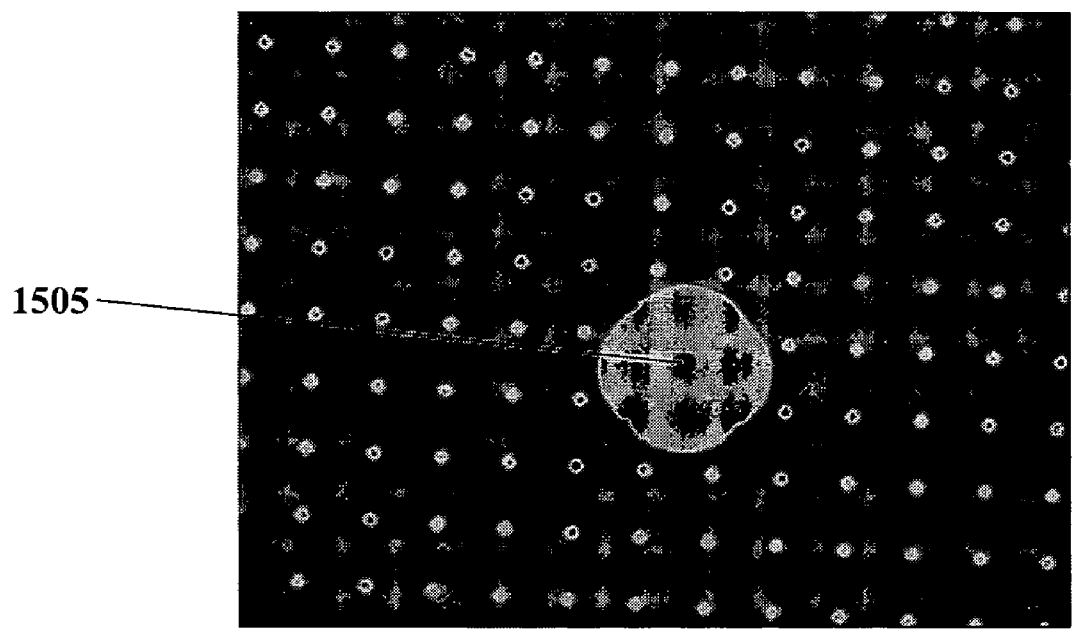
FIG. 16 shows a top view photomicrograph of an embodiment depicting radial etching by a $XeF_2$ etchant flowing through a via of an interferometric modulator substrate.

The positioning of the vias 925 and the selection of the etching conditions to produce cavities and post structures as illustrated in FIGS. 13-15 may be accomplished in various ways. FIG. 16 shows a photomicrograph of an interferometric modulator substrate (taken from the display side) after a controlled amount of a $XeF_2$ etchant was introduced through a via 1505 to etch a molybdenum material. The photomicrograph shows that the $XeF_2$ flows through the via 1505 and then etches the molybdenum in a generally radial pattern to form a cavity (the cross section is not seen here). This flow pattern may be utilized to produce an array of interferometric modulator cavities and post structures as illustrated by the series of photomicrographs shown in FIG. 17.

Figure 17:
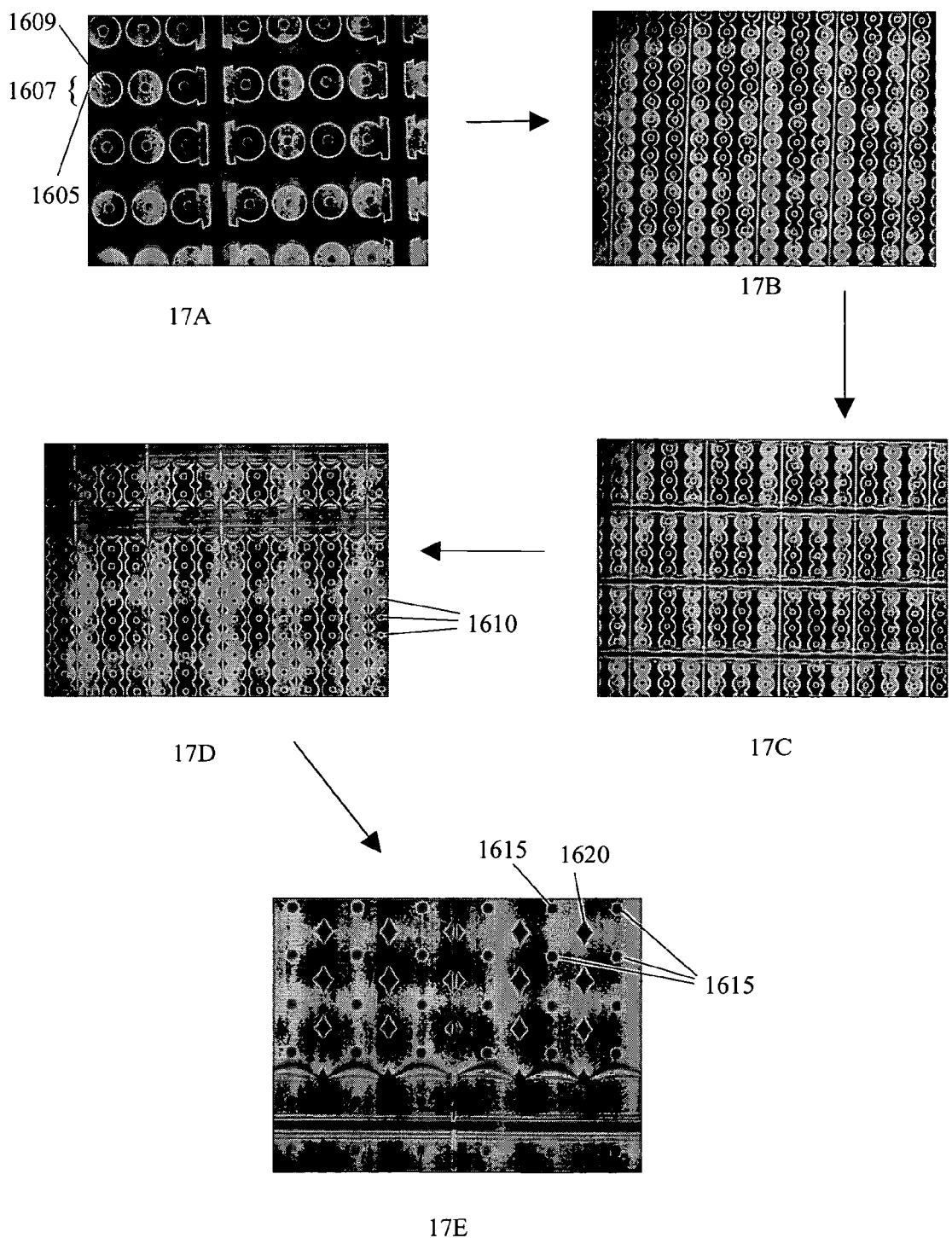
FIGS. 17A-17E show top view photomicrographs of an embodiment depicting the progressive etching of a interferometric modulator substrate by a $XeF_2$ etchant flowing through an array of vias.

FIG. 17A shows an array of cavities (including a cavity 1605) having generally circular cross-sections in the molybdenum material of an interferometric modulator substrate, resulting from a "timed etch" involving the introduction of a $XeF_2$ etchant through a corresponding array of vias (e.g., a via 1609). The photomicrograph shown in FIG. 17A was taken about one minute after the $XeF_2$ etchant was introduced through the vias (e.g., the via 1609). FIGS. 17B, 17C, 17D and 17E show photomicrographs of different interferometric modulator substrates exposed to the $XeF_2$ etchant for various periods of time. The etched substrates shown in FIGS. 17B-17E illustrate the effect of introducing the $XeF_2$ etchant through the vias 1609, 1610, and 1615 to thereby etch the molybdenum material for about two, four, six, and eight minutes, respectively. Those skilled in the art will understand that different reference numbers are used to refer to the vias in FIGS. 17A, 17D and 17E because different interferometric modulator substrates (and thus different vias) are illustrated in the series of representative photomicrographs. The diameter of the vias was about 4 microns (um) and the chamber pressure was in the range of about 20 mTorr to 2 Torr during the etching processes illustrated in FIG. 17. The series of photomicrographs in FIG. 17 illustrates the manner in which the diameters of the cavities would tend to increase as etching proceeds, from the initial stages in which the edges of the cavities (e.g., cavity edges 1607) are separated from one another to the later stages, when the cavity edges meet and merge. By stopping the etching after the cavity edges merge but prior to complete removal of the molybdenum material, remaining material is left behind to form posts. For example, the diamond-shaped post 1620 in FIG. 17E may be formed by introducing $XeF_2$ etchant through the vias 1615 until the corresponding cavities merge.

Figure 18:
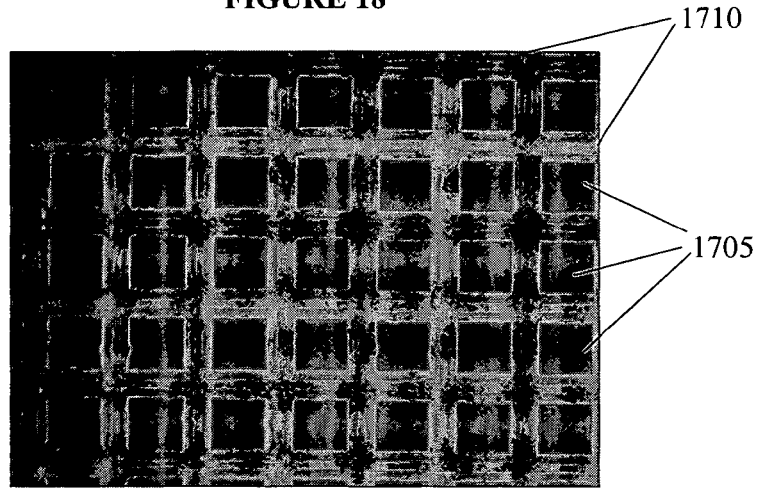
FIGS. 18A-18C show top view photomicrographs of an embodiment depicting the progressive etching of an interferometric modulator substrate by a $XeF_2$ etchant flowing through an array of horizontal and vertical vias.
Figure 18:
Figure 18:
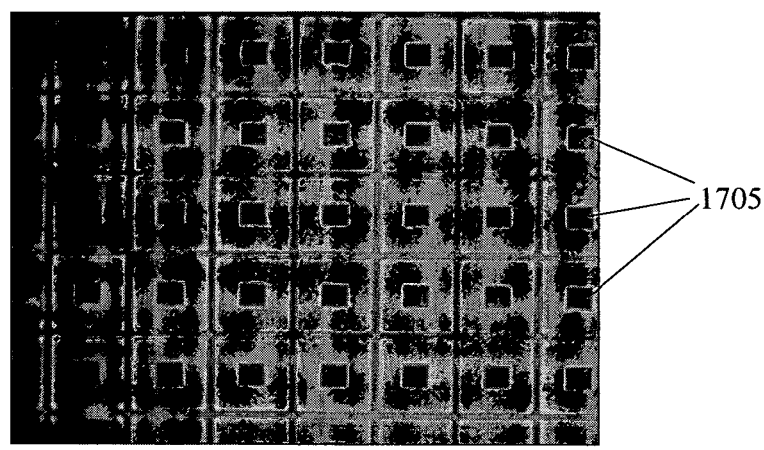
Figure 18:
Figure 18:
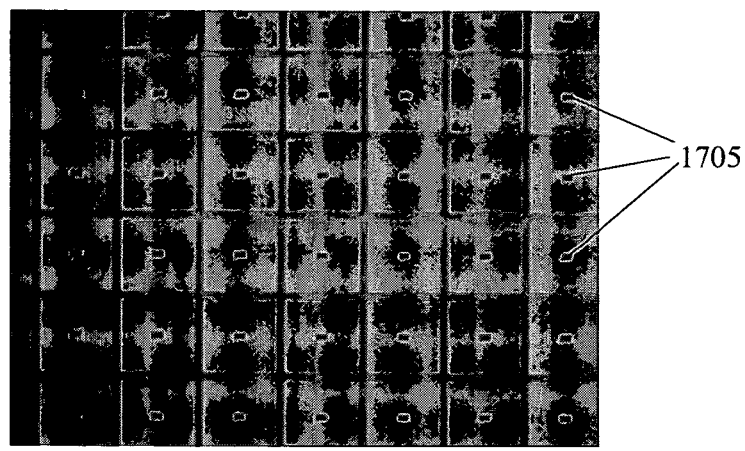

FIG. 18 illustrates a progression of representative photomicrographs illustrating the formation of interferometric modulator posts 1705 by introducing a $XeF_2$ etchant through a series of horizontal and vertical vias 1710. The vias 1710 are openings or channels in the overlying or covering layer(s), exposing the underlying molybdenum material. In FIG. 18A, the interferometric modulator substrate was exposed to $XeF_2$ vapor for about 30 seconds. In FIG. 18B, the exposure to $XeF_2$ was for about 45 seconds, and in FIG. 18C, the exposure to $XeF_2$ was for about one minute. The etching rate may be adjusted as desired by controlling the chamber pressure and/or introducing the $XeF_2$ gas to the chamber in admixture with other gas(es), e.g., in admixture with a carrier gas such as nitrogen, helium, xenon, and/or argon. Those skilled in the art will understand that apertures (including arrays of apertures) in the overlying layer and/or the substrate are preferably configured to facilitate both etching of the material layer to form the cavity and post structure, and operation of the resulting MEMS device. Thus, for example, it is preferred that apertures in the mirror layer of an interferometric modulator be configured to minimize any negative impact on the functioning of the mirror layer. Routine experimentation may be used to identify optimum aperture configurations and etching conditions.

Those skilled in the art will understand that the process embodiments illustrated in FIGS. 13-18 may also be practiced using materials that can be selectively altered so that the altered portions are rendered selectively more or less removable relative to the unaltered portions. For example, the unreleased interferometric modulator substrate 1100 illustrated in FIG. 11 may be used in place of the unreleased interferometric modulator substrate 911 illustrated in FIG. 13. In such a case, the vias 925 formed through the second mirror layer 920 to expose the molybdenum layer 910 (as illustrated in FIG. 13) would instead be formed through the second mirror layer 705 to expose the non-irradiated portions 621 of unreleased interferometric modulator substrate 1100. Removal of the non-irradiated portions 621 could then be conducted in the same general manner as illustrated in FIG. 14 and described above, with the added advantage of a wider processing window (e.g., because less risk of over-etching of irradiated portions 625 after removal of non-irradiated portions 621).

Figure 19:
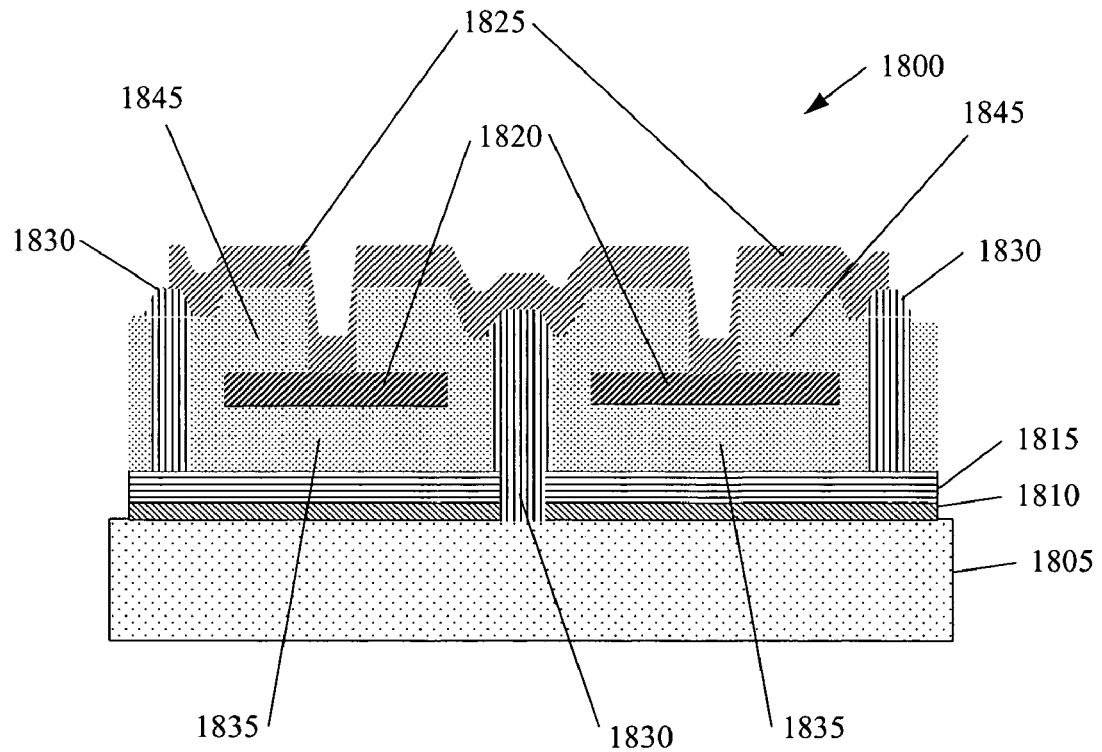
FIG. 19 shows cross sectional views of an embodiment that schematically illustrate aspects of a process flow for the fabrication of an interferometric modulator in which the upper mirror layer is suspended from a deformable or mechanical layer.
Figure 19:
Figure 19:
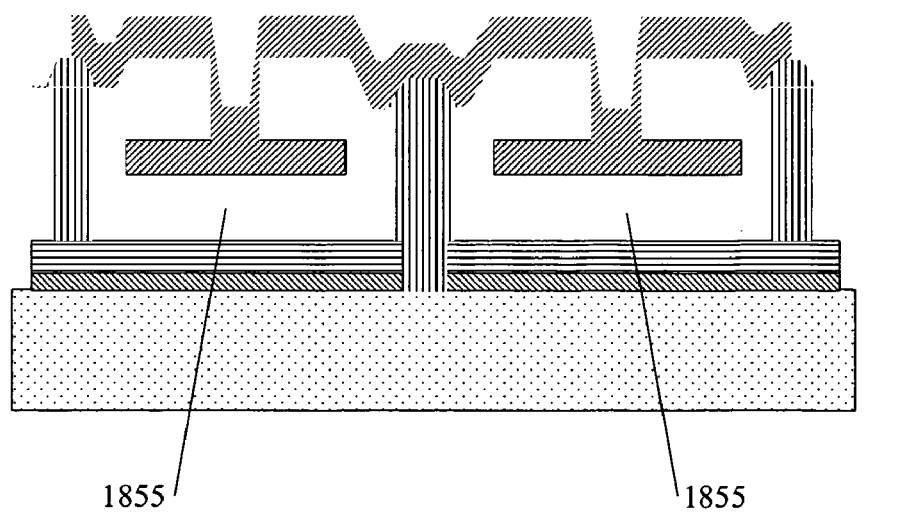

The processes described herein are also applicable to the manufacture of unreleased and released interferometric modulators of the general type illustrated in FIG. 6C, in which a second mirror layer (the moveable reflective material 14) is suspended from a deformable layer 34. Interferometric modulators of the general type illustrated in FIG. 6C may be fabricated as described in U.S. Patent Publication No. 2004/0051929 A1. Aspects of a method for fabricating interferometric modulators of the general type illustrated in FIG. 6C are illustrated by the schematic cross-sectional views shown in FIG. 19. An unreleased interferometric modulator 1800 includes a substrate 1805, a first mirror layer 1810 over the substrate 1805, a dielectric layer 1815 over the first mirror layer 1810, and a first portion of sacrificial material 1835 over the dielectric layer 1815. A second mirror layer 1820 is formed over a portion of the sacrificial material 1835, and a second portion of sacrificial material 1845 is formed over the second mirror layer 1820. The second mirror layer 1820 is attached to a deformable or mechanical layer 1825 formed over the second portion of sacrificial material 1845. Posts 1830 are formed through vias in the first and second portions of the sacrificial material 1835, 1845. The posts 1830 are configured to support the mechanical layer 1825 after the sacrificial material 1835, 1845 is removed. Exposure of the sacrificial material 1835, 1845 to an etchant results in the formation of a released interferometric modulator 1850 having interferometric cavities 1855 as illustrated in FIG. 19. After such removal, the second mirror layer 1820 is suspended from the deformable or mechanical layer 1825.

Using variants of the process described above and illustrated in FIGS. 7-9, interferometric modulators of the general type illustrated in FIG. 19 may be fabricated by methods known to those skilled in the art by using different materials to form the posts 1830 and the sacrificial material 1835, 1845. In an embodiment, it has now been found that interferometric modulators of the general type illustrated in FIG. 19 may also be fabricated by depositing a material over a first mirror layer; forming a second mirror layer over the material; and selectively removing a sacrificial portion of the material to thereby form a cavity and a post structure of the interferometric modulator, the post structure comprising a remaining portion of the material. Aspects of such an embodiment are illustrated in FIG. 20.

Figure 20A:
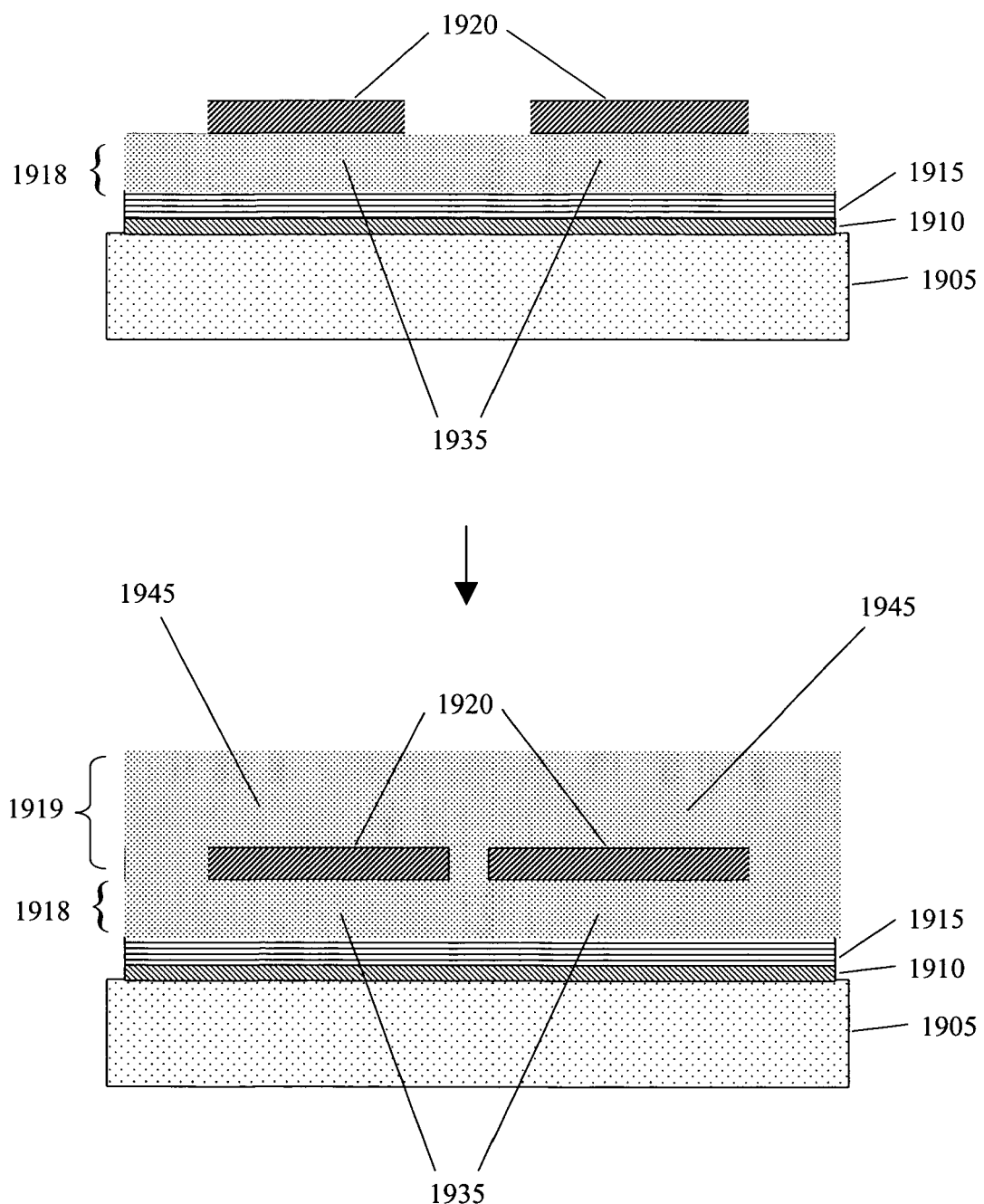
FIGS. 20A-20B show cross sectional views of an embodiment that schematically illustrate aspects of a process flow for the fabrication of an interferometric modulator in which the upper mirror layer is suspended from a deformable or mechanical layer.
Figure 20B:
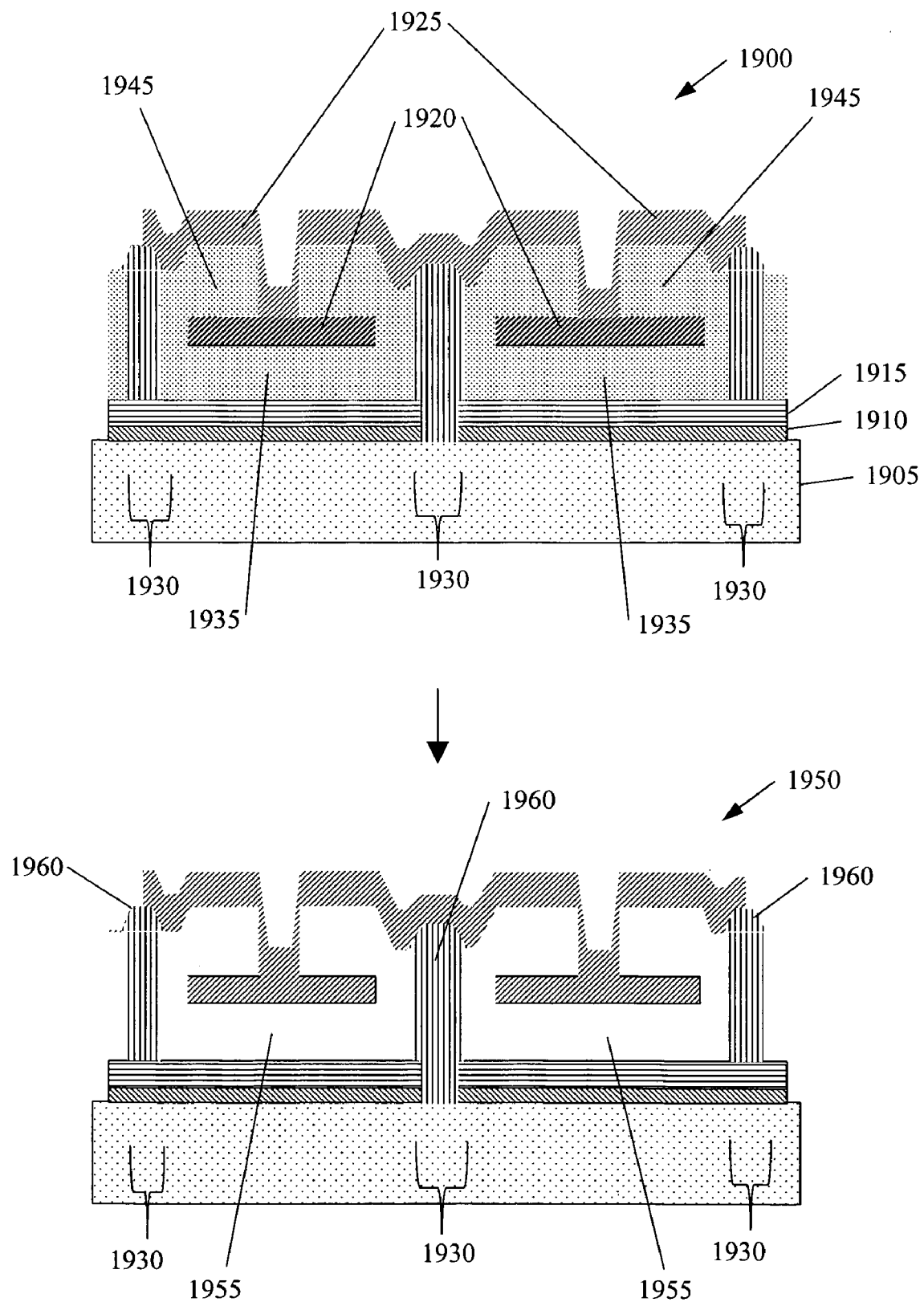

FIG. 20B shows a cross-sectional schematic view of an unreleased interferometric modulator substrate 1900 that includes a substrate 1905, a first mirror layer 1910 over the substrate 1905, a dielectric layer 1915 over the first mirror layer 1910, and a lower portion of a material 1935 over the dielectric layer 1915. A second mirror layer 1920 is formed over the lower portion of the material 1935, and an upper portion of the material 1945 is formed over the second mirror layer 1920. The second mirror layer 1920 is attached to a deformable or mechanical layer 1925 formed over the upper portion of material 1945. The upper and lower portions of the material 1935, 1945 are also formed over areas 1930 of the substrate 1905 configured to underlie support posts which will be formed as described below. In the illustrated embodiment, the upper and lower portions of the material 1935, 1945 comprise a negative photoresist that is altered when exposed to radiation (e.g., ultraviolet light). Aspects of a process for making the unreleased interferometric modulator substrate 1900 are illustrated in FIG. 20A and include forming the first mirror layer 1910 and dielectric layer 1915 on the substrate 1905, depositing a photoresist layer 1918 over the dielectric layer 1915, then forming the second mirror layer 1920 over the photoresist layer 1918 by patterning and etching. The photoresist layer 1918 includes the lower portion of the material 1935 under the second mirror layer 1920. A photoresist layer 1919 is then deposited over the photoresist layer 1918 and over the second mirror layer 1920. The photoresist layer 1919 includes the upper portion of the material 1945 over the second mirror layer 1920. The photoresist layer 1919 is then masked and etched to form vias.

As illustrated in FIG. 20B, the unreleased interferometric modulator substrate 1900 is suitably exposed to ultraviolet radiation through a reticle and the upper and lower portions of the material 1935, 1945 that are over the areas 1930 of the substrate 1905 are altered by exposure to ultraviolet light. The upper and lower portions of the material 1935, 1945 that are not over the areas 1930 of the substrate 1905 (including the lower portion of the material 1935 underlying the second mirror layer 1920 and the upper portion of the material 1945 overlying the second mirror layer 1920) are not exposed to ultraviolet light and thus form sacrificial material. The mechanical layer 1925 is then formed and attached to the second mirror layer 1920. The sacrificial material is then removed (e.g., by washing with a suitable solvent) to form cavities 1955. The altered upper and lower portions of the material 1935, 1945 over the areas 1930 remain and form posts 1960 that directly support the mechanical layer 1925 and indirectly support the second mirror layer 1920, resulting in a released interferometric modulator 1950.

Those skilled in the art will understand that interferometric modulators of the general type illustrated in FIG. 6C may also be fabricated using variants of the method illustrated in FIG. 20. For example, in an embodiment, the material 1935, 1945 may comprise a positive photoresist, in which case the pattern of exposure to irradiation through the reticle is reversed in a manner similar to that described above for the embodiment illustrated in FIG. 12. In another exemplary embodiment, the material 1935, 1945 comprises silicon, and is selectively altered by oxygen ion implantation to form a silicon oxide in a manner similar to that described above for the embodiment illustrated in FIG. 10. Thus, for example, the silicon may be removed to form a cavity, e.g., by selectively etching against the silicon oxide, leaving the remaining silicon oxide to form a post. In another exemplary embodiment, selective etching techniques similar to those described above for the embodiments illustrated in FIGS. 13-18 are applied to the material 1935, 1945, including optional alteration of the material prior to such selective etching to make the sacrificial portions selectively etchable relative to the portions that remain behind to form the posts.

While the above detailed description has shown, described, and pointed out novel features of the invention as applied to various embodiments, it will be understood that various omissions, substitutions, and changes in the form and details of the device or process illustrated may be made by those skilled in the art without departing from the spirit of the invention. As will be recognized, the present invention may be embodied within a form that does not provide all of the features and benefits set forth herein, as some features may be used or practiced separately from others.

What is claimed is:

1. A method for making an interferometric modulator, comprising:
   depositing a material over a first electrode layer;
   depositing a second layer over the material, the second layer comprising a plurality of openings formed therethrough, the openings being configured to expose the material and to facilitate operation of the resulting interferometric modulator;
   flowing an etchant through the openings; and
   etching the material to remove a sacrificial portion of the material to thereby form a plurality of cavities each having a cavity edge and at least one support structure, the support structure comprising a remaining portion of the material, the etching being non-selective between the sacrificial portion and the remaining portion of the material, wherein at least one cavity edge merges with one or more other cavity edges to form the support structure.

2. The method of claim 1 in which the material is selected from the group consisting of molybdenum and silicon.

3. The method of claim 1 in which the etching of the material is selective against the second layer.

4. The method of claim 1 in which the etching comprises laterally recessing the material away from the openings.

5. The method of claim 1 in which the etching is isotropic etching.

6. The method of claim 1 in which the etchant comprises $XeF_2$.

7. The method of claim 1 further comprising etching the second layer to form the plurality of openings.

8. The method of claim 1 in which the first electrode layer comprises a first mirror.

9. The method of claim 8 in which the second layer comprises a second electrode.

10. The method of claim 9 in which the second layer further comprises a second mirror.

11. The method of claim 1 in which the second layer comprises a mechanical layer.

12. The method of claim 11 further comprising depositing a mirror layer, at least a portion of which is suspended from the mechanical layer after etching to remove the sacrificial portion of the material.

13. The method of claim 12 in which the etching to remove the sacrificial portion is selective against the mirror layer.

14. The method of claim 12 in which the support structure has a re-entrant profile.

15. A method for making an interferometric modulator, the interferometric modulator comprising at least a first mirror, a second mirror separated from the first mirror by a plurality of cavities each having a cavity edge, and at least one support structure positioned at a side of the cavities and configured to support the second mirror spaced from the first mirror, the method comprising:
   providing a substrate, the substrate having a first area configured to underlie the first mirror and a second area configured to underlie the support structure;
   depositing a first mirror layer over at least the first area;
   depositing a material over the first area and over the second area;
   depositing a second mirror layer over at least the material over the first area; and
   forming a plurality of openings configured to facilitate flow of an etchant to the material over the first area and to facilitate operation of the resulting interferometric modulator;
   the material over the first area being removable by the etchant to thereby form the plurality of cavities and the support structure, where the support structure comprises the material over the second area, the material having substantially uniform properties, wherein at least one cavity edge merges with one or more other cavity edges to form the support structure.

16. The method of claim 15 in which the material is selected from the group consisting of molybdenum and silicon.

17. The method of claim 16 further comprising removing at least a part of the material over the first area to thereby form the plurality of cavities.

18. The method of claim 17 wherein removing at least a part of the material over the first area to thereby form the plurality of cavities comprises a timed etch.

19. The method of claim 17 wherein removing at least a part of the material over the first area to thereby form the plurality of cavities comprises laterally recessing the material away from the plurality of openings.

20. The method of claim 18 in which the etchant comprises $XeF_2$.

21. The method of claim 15 in which the plurality of openings is formed through the second mirror layer.

22. The method of claim 15 further comprising forming a mechanical layer over at least the material over the first area.

23. The method of claim 15 in which the plurality of openings comprises a via.

24. The method of claim 15 in which the plurality of openings comprises a plurality of intersecting channels.

25. The method of claim 1 in which the etching comprises a timed etch.

26. The method of claim 1 in which the support structure comprises a post.

* * * * *

UNITED STATES PATENT AND TRADEMARK OFFICE
CERTIFICATE OF CORRECTION

| | | |
|---|---|---|
| PATENT NO. | : 7,429,334 B2 | Page 1 of 1 |
| APPLICATION NO. | : 11/090778 | |
| DATED | : September 30, 2008 | |
| INVENTOR(S) | : Ming-Hau Tung, Manish Kothari and William J. Cummings | |

It is certified that error appears in the above-identified patent and that said Letters Patent is hereby corrected as shown below:

On the title page after *Primary Examiner*, please delete "Duy-Vu N. Deo" and insert therefore, --Nadine G Norton--.

Page 4, at column 1, line 55, under U.S. Patent Documents, please delete "Naairi et al" and insert therefore, --Nasiri et al--.

Page 5, at column 1, line 57, under Foreign Patent Documents, please delete "WO 04/079058" and insert therefore, --WO 04/079056--.

Page 5, at column 2, line 10, under Other Publications, please delete "IMbit/sec" and insert therefore, --1Mbit/sec--.

Page 6, at column 2, line 59, under Other Publications, please delete "corresponging" and insert therefore, --corresponding--.

Column 6, line 31, please delete "PENTIUMBIII®," and insert therefore, --PENTIUMIII®,--.

Column 7, line 20, please delete "column" and insert therefore, --column electrodes. The row 1 pixels are unaffected by the row 2 pulse, and remain in the state they--.

Signed and Sealed this

Seventeenth Day of March, 2009

JOHN DOLL
*Acting Director of the United States Patent and Trademark Office*